United States Patent [19]

Putatunda et al.

[11] Patent Number: 4,815,003

[45] Date of Patent: Mar. 21, 1989

[54] STRUCTURED DESIGN METHOD FOR HIGH DENSITY STANDARD CELL AND MACROCELL LAYOUT OF VLSI CHIPS

[75] Inventors: Rathindra N. Putatunda, Marlton; David C. Smith, Williamstown; Stephen A. McNeary, Somerville, all of N.J.

[73] Assignee: General Electric Company, Moorestown, N.J.

[21] Appl. No.: 64,044

[22] Filed: Jun. 19, 1987

[51] Int. Cl.$^4$ .............................................. G06F 15/46
[52] U.S. Cl. .................... 364/491; 364/490; 364/489; 364/488
[58] Field of Search ............... 364/488, 489, 490, 491, 364/300

[56] References Cited

U.S. PATENT DOCUMENTS

| H512 | 8/1988 | Borgini et al. | 357/42 |
|---|---|---|---|
| 3,617,714 | 11/1971 | Kernighan et al. | 235/150 |
| 3,653,072 | 3/1972 | Ballas et al. | 364/491 |
| 4,377,849 | 3/1983 | Finger et al. | 364/491 |
| 4,554,625 | 11/1985 | Otten | 364/491 |
| 4,577,276 | 3/1986 | Dunlop et al. | 364/491 |
| 4,584,653 | 4/1986 | Chih et al. | 364/491 |
| 4,593,363 | 6/1986 | Burstein et al. | 364/491 |
| 4,651,284 | 3/1987 | Watanabe | 364/491 |
| 4,656,592 | 4/1987 | Spaanenburg et al. | 364/490 |
| 4,688,072 | 8/1987 | Heath et al. | 364/491 |

OTHER PUBLICATIONS

"Binary Decision Diagrams" by S. B. Akers, IEEE Transaction on Computers, vol. C-27, No. 6, Jul. 1978, pp. 509–516.
"Happi: A Chip Compiler Based on Double-Level-Metal Technology", Putatunda, R. N.; Smith, D. C.; McNeary, S.A. and Crabbe, J.; published in conjunction with the Design Automation Conference, Jun. 29, Jul. 2, 1986.
"Speeding Up Placement and Routing" by Naegale, published at p. 29 of the Jul. 10, 1986 issue of Electronics magazine.
"Happi: Fully Automatic Design for Submicron Subnanosecond IC Designs with from 50K to 400K Transistors", by Putatunda et al., published around Nov. 1985.
"The Genealogical Approach to the Layout Problem", by Szepieniec et al., published in conjunction with the 17th Design Automation Conference, Jun. 23–25, 1980.
"Linear Ordering and Application to Placement" by Kang, published in conjunction with the ACM IEEE 20th Design Automation Conference, Jun. 27–29, 1983.
"A New Gridless Channel Router: Yet Another Channel Router the Second (YACR-II)" by Sangiovanni--Vincentelli et al., published in conjunction with the IEEE International Conference on Computer Aided Design, Nov. 12–15, 1984.

Primary Examiner—Parshotam S. Lall
Assistant Examiner—V. N. Trans
Attorney, Agent, or Firm—Clement A. Berard, Jr.; William H. Meise

[57] ABSTRACT

A chip layout system lays out chips including adjustable-shaped domains of standard cells and fixed-size macrocells. The system orders those standard cells which have interconnections into binary pairs or groupings of two. The binary pairs are grouped in higher and higher order groupings based upon evaluations of the area of the grouping and the sum of the lengths of the interconnections. All possible permutations of placement configuration including some rotations of various elements are further evaluated and the final placement is established on the basis of a minimum area, minimum interconnect length criterion. During the processing, the aspect ratios of the various domains and grouping of domains are adjusted to optimize their placement on the chip surface.

13 Claims, 21 Drawing Sheets

NUMBER OF CONNECTIONS FOR THIS NET
IS 3, CONNECTING 4 LOGIC ELEMENTS

ALL PLACEMENT CONFIGURATIONS FOR TYPE A SUBTREE WITH 3 LEAF NODES

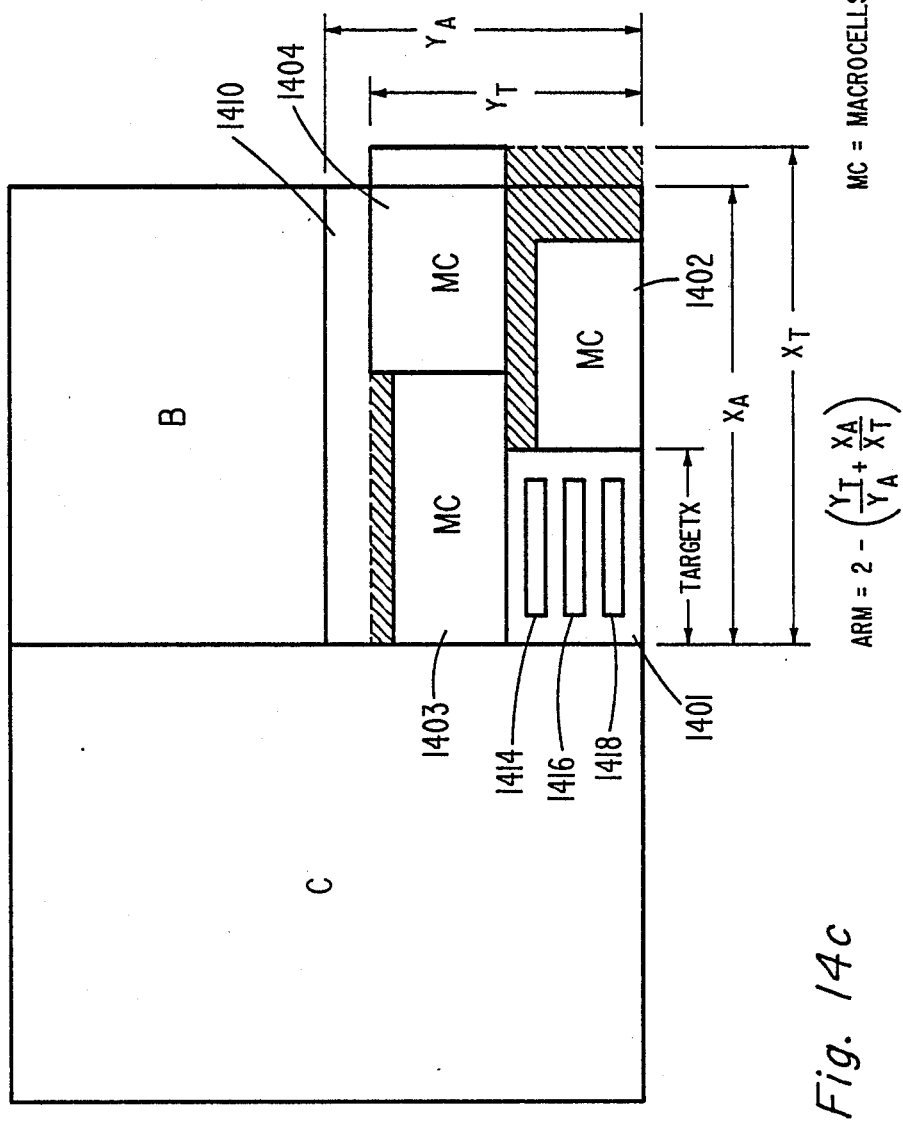

STRUCTURED DESIGN METHOD FOR HIGH DENSITY STANDARD CELL AND MACROCELL LAYOUT OF VLSI CHIPS

BACKGROUND OF THE INVENTION

This invention relates to a method for laying out an integrated circuit chip including intermixed fixed size and shape rectangular macrocells together with amorphous clusters of standard cells.

Modern integrated circuit technology is widely used for communications and control. Because of the advantages of reliability and operating speed, the complexity of integrated circuit chips has increased with time, notwithstanding the disadvantages of lower yields occasioned by such complex chips. At the current state of technology, up to one million transistors may be used on a single large-scale integrated circuit.

While such large integrated circuits are advantageous, the initial layout of such complex devices, and of the interconnections between the transistors presents problems in the length of time required to accomplish the layout of the interconnections, the total man-hours required, and in the high skill required of the layout personnel. Furthermore, human layout is subject to the problem of errors, and also is undesirably dependent upon human intuition, rather than upon rote evaluation of all possible permutations of the layout. Thus, layout by humans may not be optimum in terms of the chip size and operating speed of the resulting integrated circuit. The larger chip size resulting from human layout, in turn, results in lower yields during the manufacture of the integrated circuit, which increases the cost.

As a result of the limitations of human layout, it has become common to lay out the integrated circuits including the transistors and their interconnections by means of computer-aided design. These computerized layout systems accept as inputs an interconnection list between the logic elements. In this context, logic elements are relatively primitive electrical circuit such as AND gates, OR gates, and the like. Such logic elements are often standard cells having a fixed dimension and a variable dimension to aid in their placement. Other inputs to the computer layout program include the physical sizes associated with the standard cells, and the locations of the connection points (pins) around the peripheries of the standard cells.

Various methods have been devised for operating on this information to produce the desired layout. One method is described in U.S. Pat. No. 4,593,363 issued June 3, 1986 to Burstein et al. This method operates only with standard cells. This has the disadvantage that LSI layouts including macrocells cannot be conveniently handled except by the intervention of human layout experts. Macrocells, on the other hand, are relatively sophisticated circuits such as memories or multipliers, digital filters and the like, which have fixed dimensions, often because they were laid out by hand. In general, the structure of macrocells is regular. Furthermore, Burstein et al. optimizes the layout for operating speed and not for chip area. Another system is described in U.S. Pat. No. 4,577,276 issued March 18, 1986 to Dunlop et al., which has the same disadvantages as Burstein et al. Copending U.S. allowed application Ser. No. 886,936, filed July 21, 1986, by Noto et al., entitled "Logic Cell Placement Method in Computer-Aided-Customization of Universal Arrays and Resulting Integrated Circuit," is a logic cell placement method for gate arrays, which are fixed structures. These logic arrays are fixed-size chips laid out with an inflexible array of logic elements, which are interconnected in various ways by variations of the last masking level.

The circuits normally found in the form of macrocells are used in many systems, and it is very desirable to be able to include them in a large scale integrated (LSI) circuit. It would be advantageous to have an automated chip layout system which simultaneously optimizes chip speed and minimizes area, and which handles intermixed standard cells and macrocells.

SUMMARY OF THE INVENTION

A method for laying out an assemblage of intermixed fixed size and shape macrocells and amorphous clusters of standard cells include the steps of determining the affinity factors for all possible pairings of logic elements, and of generating low-order standard cell (defined supra) subdomains (defined below in conjunction with the description of FIG. 4) consisting of logic element pairs having the largest or most positive affinity factors (defined below, also in conjunction with FIG. 4). A second affinity evaluation is performed for determining the affinity factors of all possible combinations of standard cell subdomains and logic elements. Higher-order standard cell subdomains are generated by pairings having the next most positive affinity factors, consisting of pairings of standard cell subdomains with other standard cell subdomains, standard cell subdomains with logic elements, or logic elements with other logic elements, which pairings are only of elements having identical affinities. The second affinity evaluating and higher-order generating steps are iteratively repeated for pairs, the elements of which have values of affinity factor which are progressively lower and lower (progressively less positive), resulting in higher and higher-order subdomains, until combining any pair results in an affinity factor equal to or more negative than zero. The remaining subdomains are designated as domains. A third affinity evaluation is performed for all possible pairs of domains and macrocells. Those pairs having the smallest negative affinity values are paired to form low-order superdomains. A fourth affinity evaluation is performed for evaluating all possible pairs of superdomains, standard cell domains and macrocells, and higher-order superdomains are formed by forming into pairs the remaining superdomains, standard cell domains and macrocells. The fourth affinity evaluating and forming steps are iteratively repeated for progressively larger negative values of affinity factor until only one superdomain remains. This forms a binary tree structure including leaf nodes, with the one remaining superdomain as its root. The size and shape of the target are are established. The binary tree structure is evaluated to identify as B subtrees those structures in which the number of domains and macrocells is less than a predetermined number. In one embodiment, the predetermined number is seven. The B root superdomains of each B subtree are identified. The binary tree structure is further evaluated to identify A subtrees in which the number of B root superdomains is less than a second predetermined number.

In a particular embodiment, the second predetermined number is nine. The A root superdomains of each A subtree are tagged. The steps of identification of A subtrees and tagging of A root superdomains are iteratively repeated to form subtrees of successively higher level until the entirety of the binary tree has been classified and only a single A root superdomain remains. Beginning with the A subtree of highest order, and proceeding to subtrees of lower order only when all higher order subtrees have been processed, all permutations are successively formed, within the target area, of right-left, top-bottom topological configurations of those superdomains which form the leaves of each A subtree, while retaining a rectangular form having an aspect ratio selected to accept any macrocells contained therein. For each of the A subtrees for which all possible right-left, top-bottom topological configurations are formed, the sum of the distances between the closest portions of interconnected superdomains of each configuration is evaluated. A quality criterion is formed including the sum of the distances as a factor. That one topological configuration for which the quality criterion is optimized is selected for further processing. The steps of evaluating the sums of the distances and forming all topological configurations are iteratively repeated for all A subtrees, whereupon only B subtrees remain. All possible permutations of the form of each B subtree are formed, and for each possible permutation of each B subtree, all possible right-left, top-bottom topological permutations are evaluated to optimize a second quality criterion which includes at least one of (a) minimizing area, (b) aspect ratio match, and (c) the sum of the lengths of the nets between the interconnected standard cell domains and macrocells. For each of the B subtrees, that one permutation is selected for which the second quality criterion is optimized. When the optimization of the placement of the regions constituting the leaves of the binary tree has been accomplished, the binary tree is pruned of the lowest-level subtrees, the next higher-level subtrees are designated as B trees, and the optimization continues iteratively.

DESCRIPTION OF THE DRAWING

FIGS. 11b–11q, referred to jointly as FIG. 11, represent the right-left, top-bottom physical layouts which are evaluated by the flowchart of FIG. 10 for a particular tree branching structure illustrated in FIG. 11a;

FIGS. 14a–11c illustrates a chip surface and certain dimensions useful in understanding the aspect ratio match (ARM) criterion used in the evaluation performed by the flowchart of FIG. 12;

DESCRIPTION OF THE INVENTION

Figure 1:
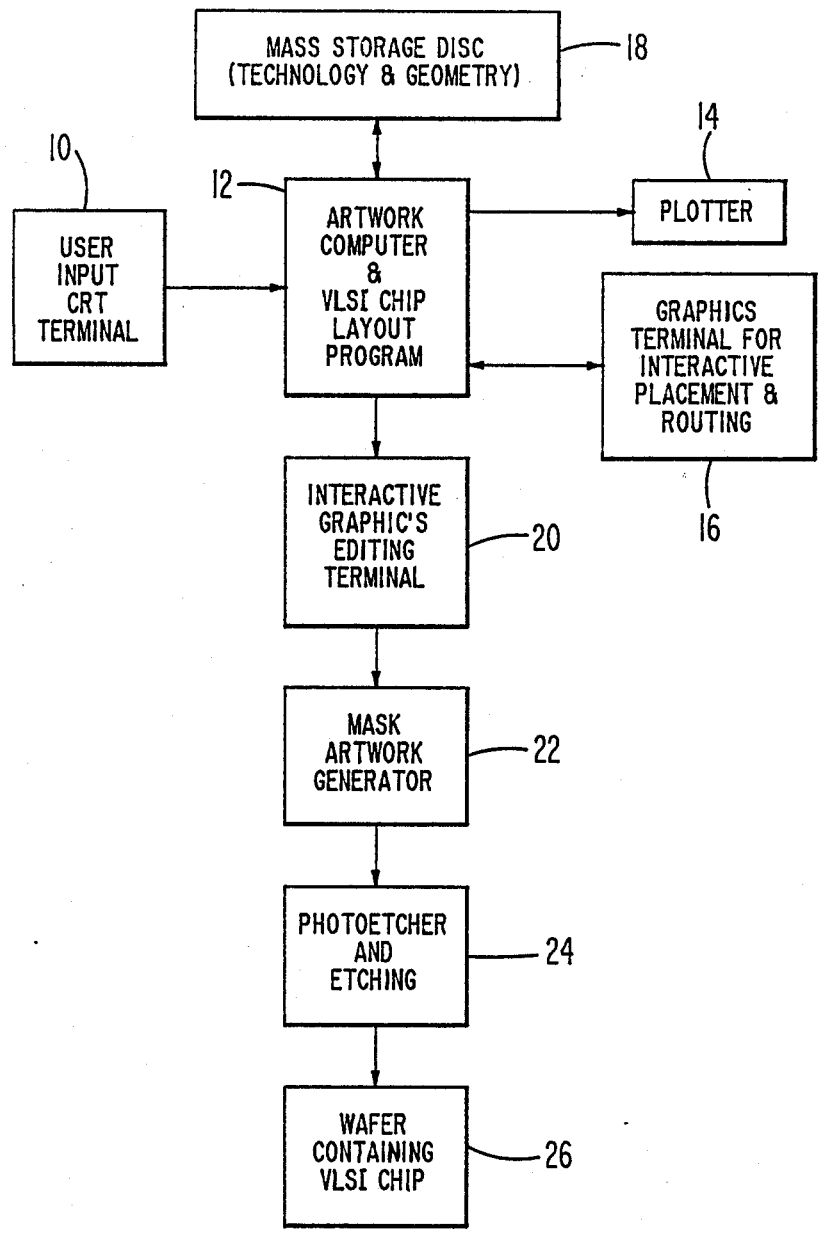
FIG. 1 is a general block diagram of a chip layout system including the invention.

FIG. 1 is a general block diagram of an arrangement for laying out integrated circuits in accordance with the invention. In FIG. 1, a block 10 represents a CRT or display terminal at which the user supplies inputs relating to the chip which is to be laid out. The terminal, under user control, provides control information for controlling the operation of the program described below, and also provides parameter information, which is detailed control information relating to the particular chip being laid out (such as the type of technology to be used, i.e., CMOS, NMOS, bipolar, SOS, etc.), and interconnection information, which is essentially a schematic diagram of the integrated circuit chip being laid out. The user input information is applied to a computer in which a VLSI chip artwork generation program resides, which is described below. A plotter 14 is coupled to computer 12 for plotting the artwork produced as a result of the program, if desired. A mass storage disc is coupled to computer 12. Disc 18 includes technology information which includes predetermined design rule information relating to specific technologies, such as CMOS, SOS, or bulk, and geometry information for the standard cells and for the macrocells which are used in the layout. This technology and geometry information is made available to computer 12 when the information is required by the resident artwork generation program. A graphics terminal 16 for interactive placement and routing modification is coupled to computer 12. Graphics terminal 16 displays the layout generated by the program in an user-interactive manner to aid in viewing and monitoring the layout process. Graphics terminal 16 is shown as separate from user input CRT terminal 10 because it requires substantial graphics display capability. An interactive graphics editing terminal 20 is coupled with computer 12 for receiving the optimized chip circuit layout for controlling the final layout. Terminal 20 provides user control for the layout of chip-related details including the use of test transistors, various mask layers, and the like. Terminal 20 is connected to a mask artwork generator 22 which receives information from terminal 20 and generates commands for operating a photoetcher 24, which prepares the complete wafer including multiple chips and their various mask levels. Generator 22 may also produce a conventional hard copy artwork. Following the photoetching, the photoetcher also includes an arrangement for performing the etching, diffusion, and other processes required to generate the final finished wafer, illustrated as 26. The arrangement of FIG. 1 illustrates all the operations as interconnected, but those skilled in the art recognize that the information developed at any step or apparatus may be stored for later use in the next step.

Figure 2:
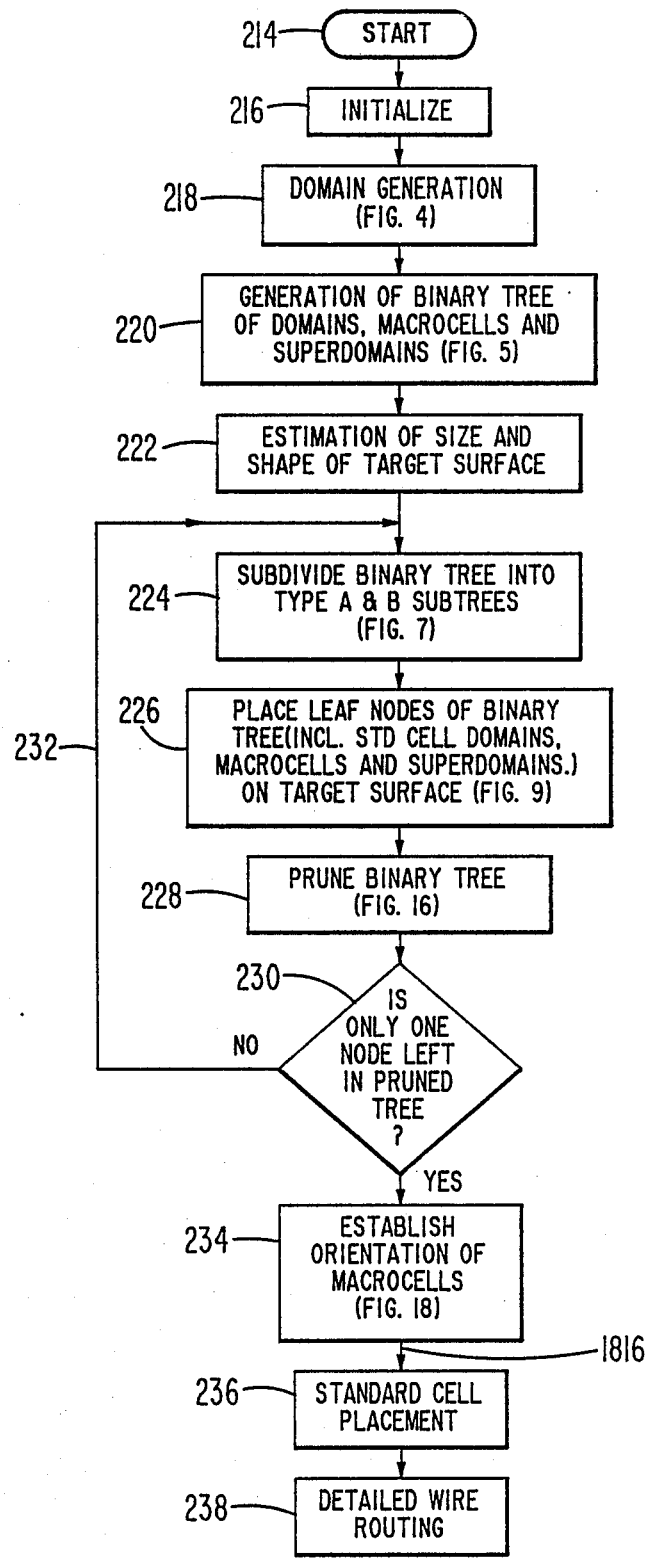
FIG. 2 is a general flowchart describing the operation of a chip artwork generation program included in the arrangement of FIG. 1.

FIG. 2 illustrates an overall logic flowchart or diagram 212 which describes, in general terms, the operation of the artwork layout program contained or resident in computer 12 of FIG. 1. In general, the flowchart of FIG. 2 accepts geometry information relating to macrocells and standard cells contained in the chip to be laid out, and interconnection information, and generates an artwork in which overall physical area of the chip is minimized, and in which the total interconnection distance between the various standard cells and macrocells of the circuit are minimized for highest operating speed.

In FIG. 2, the process is begun with a start command 214, followed by an initialization step 216 which includes the reading of the user information, after which the logic flows to a block 218, in which domains are generated by higher-and-higher-order pairings of subdomains. These domains are groups of interconnected logic elements of the standard cell type. The domain generation step is detailed below in conjunction with FIG. 4. From the domain generation step, the logic flows to a block 220, which represents generation of a binary tree of domains, macrocells, and superdomains. As mentioned, domains are groupings of interconnected standard cells. Macrocells are predesigned groupings of logic elements which have a fixed size and aspect ratio as a result of the previous design. Most often, these are regular arrays of elements produced by human designers, such as memories, multipliers, ROMs, and the like. Standard cells, on the other hand, are more primitive or basic logic elements such as AND gates, OR gates, and the like, which are so small that they may almost be considered to be points from the point of view of layout, and which may be readily manipulated by the computer. The term superdomains, for this purpose, includes groupings of macrocells and standard cell domains, or groupings of lower-order superdomains with either macrocells or standard cell domains. Details of the logic of block 220 are described in conjunction with FIG. 5.

From block 220, the logic proceeds to a further block 222, in which estimation of the size and shape of the chip surface is performed based upon the size of the macrocells involved, and on the total area of the standard cell domains, plus an estimate of the interconnection conductor routing requirements. Steps 218, 220, and 222 taken together, group the standard cells into domains, and group domains and macrocells into superdomains, conceptually forming binary tree arrangements with leaves or nodes of higher and higher order.

Figure 9:
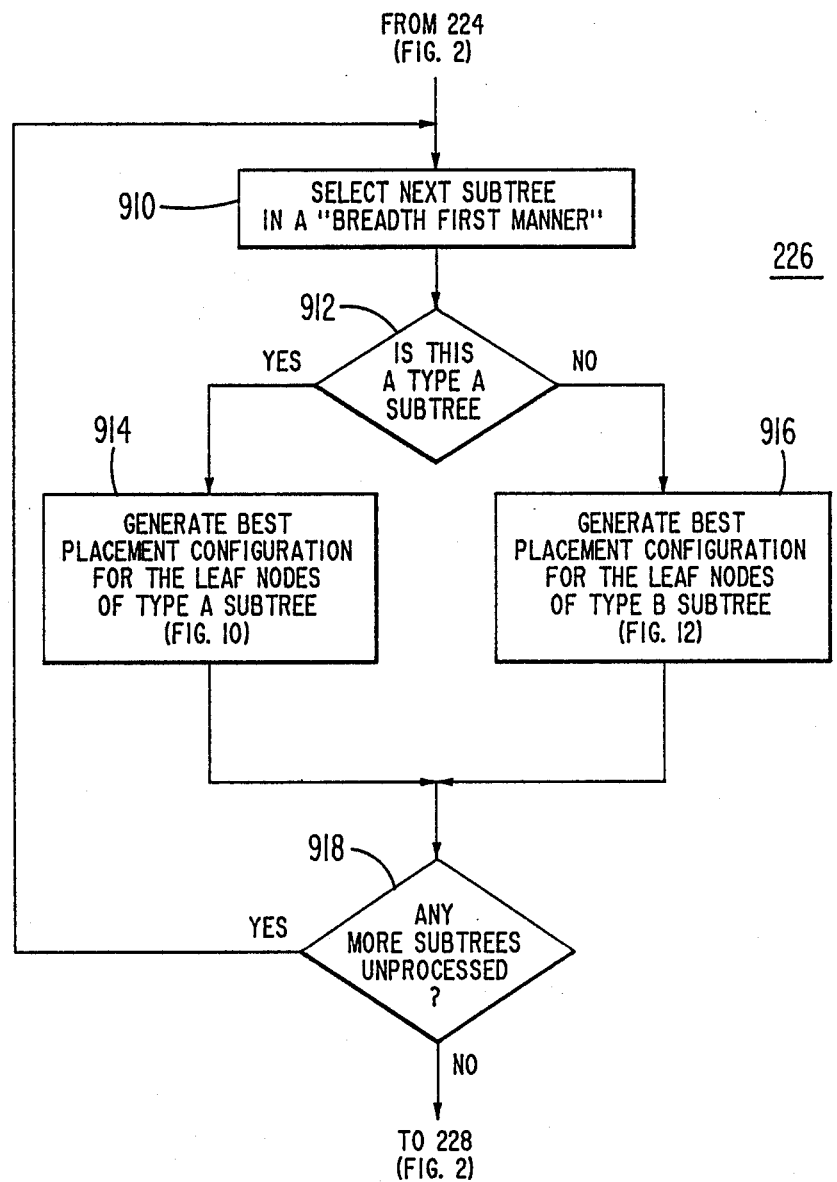
FIG. 9 is a more detailed flowchart of a portion of the flowchart of FIG. 2 which relates to placement on the chip surface of leaf nodes of the subtrees of the binary tree.
Figure 16:
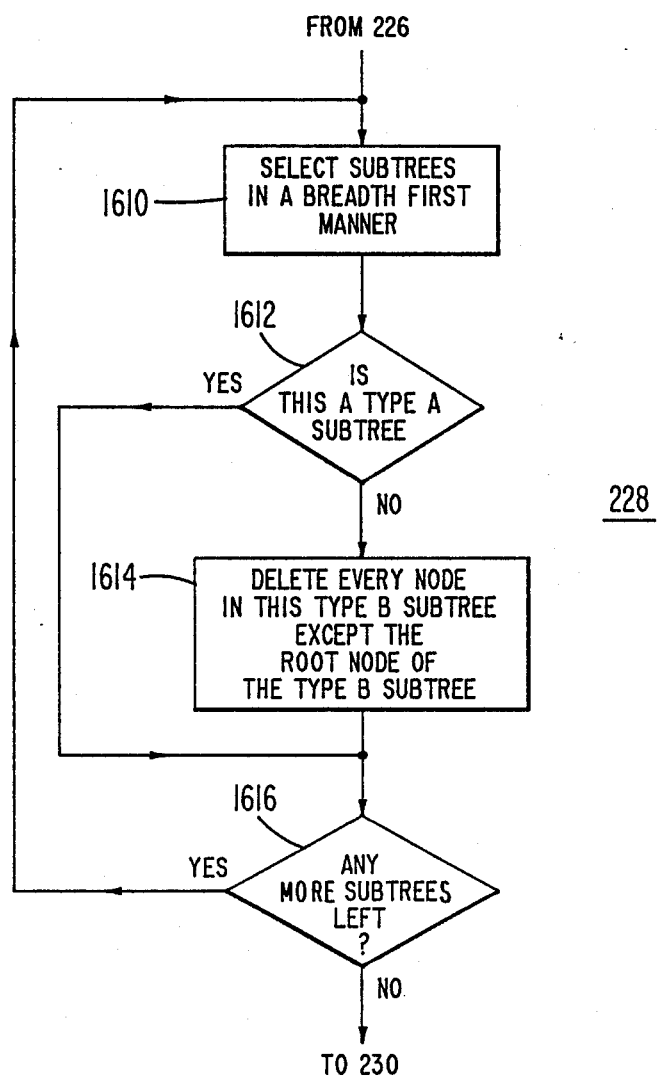
FIG. 16 is a more detailed flowchart which is a portion of the flowchart of FIG. 2, relating to pruning of the binary tree.
Figure 18:
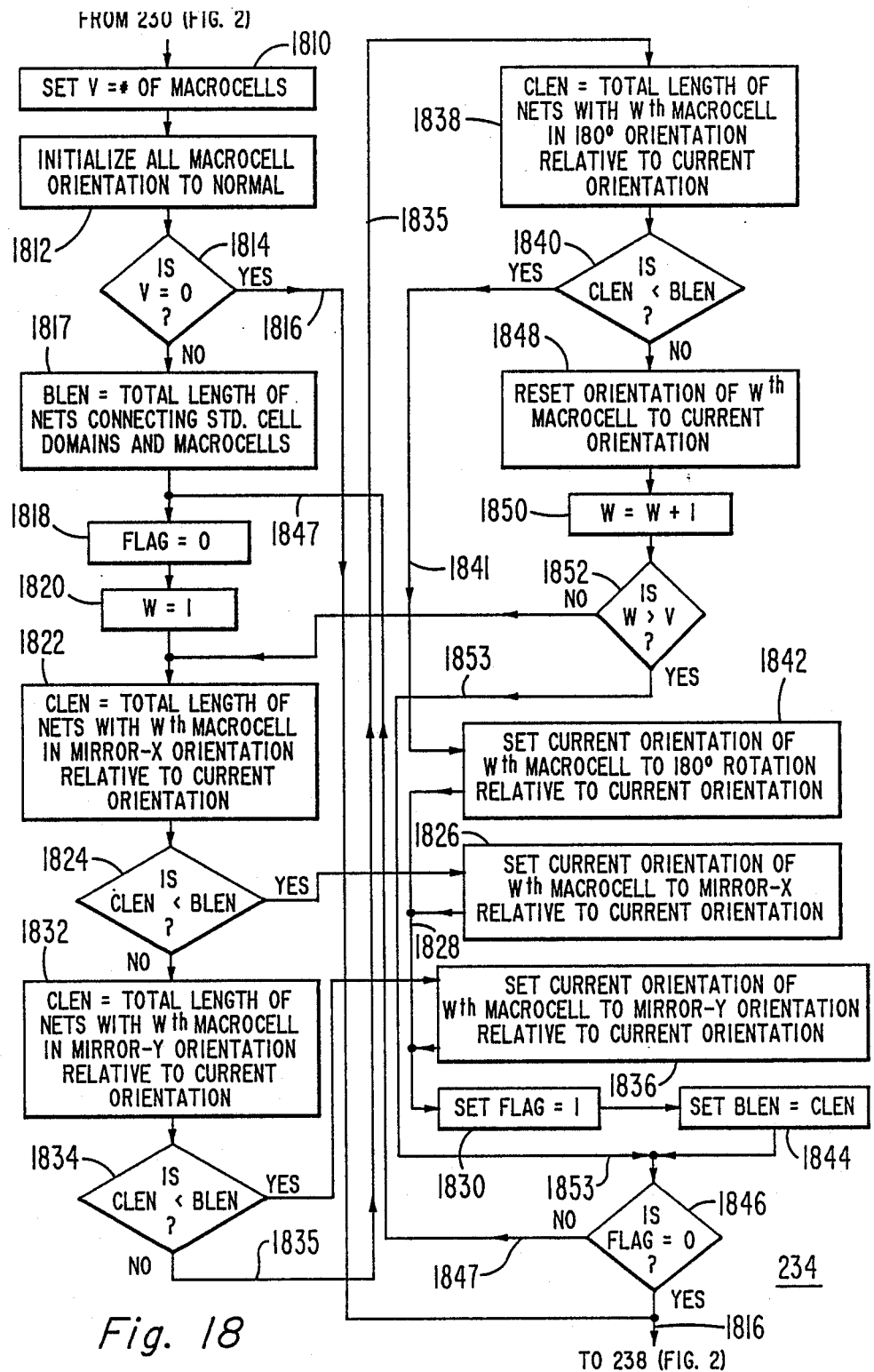
FIG. 18 is a more detailed flowchart of the flow diagram of FIG. 2, relating to optimizing the placement of macrocells in mirror-image or rotated positions.

The logic flows from block 222 to a block 224, in which the binary trees are subdivided into type A and type B subtrees. Type A subtrees are subtrees which have no more than a predetermined number of leaves. The predetermined number is based upon considerations relating to the amount of computer time required to consider all possible configurations or topological permutations of elements. In type A subtrees, the leaf nodes (nodes) are superdomains which have not yet been assigned actual X and Y dimensions. Type B subtrees are the lowest level of subtree, which have no more than a second predetermined number of leaf nodes. Each leaf node in a type B subtree has been assigned discrete X and Y dimensions, as described below in conjunction with FIG. 7. From logic block 224, the logic proceeds to a further block 226, which represents the placement on the chip target area or surface of leaf nodes of the binary tree. This step is described in greater detail below (FIG. 9). From block 226, the logic proceeds to a further block 228, which represents the pruning of the binary tree, also described below (FIG. 16). The logic then arrives at a decision block 230, in which the pruned binary tree is examined to determine the number of remaining nodes. If the number of remaining nodes exceeds unity, the logic returns by a path 232 to logic block 224. The logic iteratively traverses blocks 224–228, reducing the number of nodes in the primed binary tree at each traversal. When processing has proceeded to the point at which only one node remains, the logic proceeds by the YES output of decision block 230 to a further block 234, in which the orientation of the macrocells is established (FIG. 18). From block 234, the logic proceeds to a further block 236, which represents standard cell placement in the standard cell domains, as known in the prior art, for example, from a paper entitled "Linear Ordering and Application to Placement," by S. Kang, published in the *Proceedings of the ACM IEEE*, 20th Design Automation Conference, June 27–29, 1983, at Miami Beach, Fla. From block 236, the logic flows to a further block 238, which represents completion of the detailed routing. This routing is accomplished by any of a number of programs such as are known in the prior art, including "A New Gridless Channel Router: Yet Another Channel Router the Second (YACR-II)," by A. Sangiovanni-Vincentelli et al., published in the *Digest of Technical Papers* of the IEEE International Conference on Computer Aided Design, Nov. 12–15, 1984 at Santa Clara, Calif.

Figure 3A:
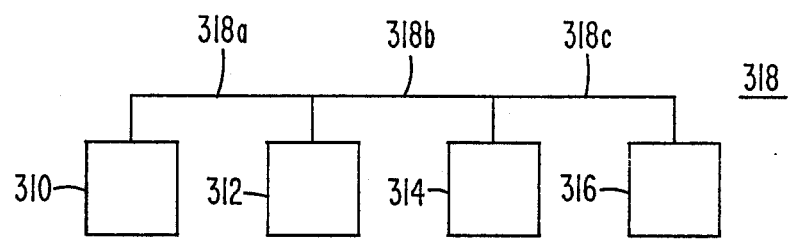
FIGS. 3a and 3b are depictions of interconnections between elements useful in understanding the invention.

In FIG. 3a, a plurality of standard cell logic elements 310, 312, 314, and 316 are interconnected by a net 318. As mentioned, a standard cell logic element is a primitive logic element such as an AND gate, OR gate, or the like, which has at least one adjustable dimension. Net 318 is a single conductor. Net 318 is segmented into three "connection" portions (connections). Net 318 includes a first connection portion 318a, a second connection portion 318b, and a third connection portion 318c, which together interconnect the four elements 310–316. Thus, the number of connections is three one less than the number of logic elements which are interconnected. If there are only two logic elements interconnected by a net, the number of connections is therefore one. In general, if there are N logic elements, there are N−1 connections.

Figure 3B:
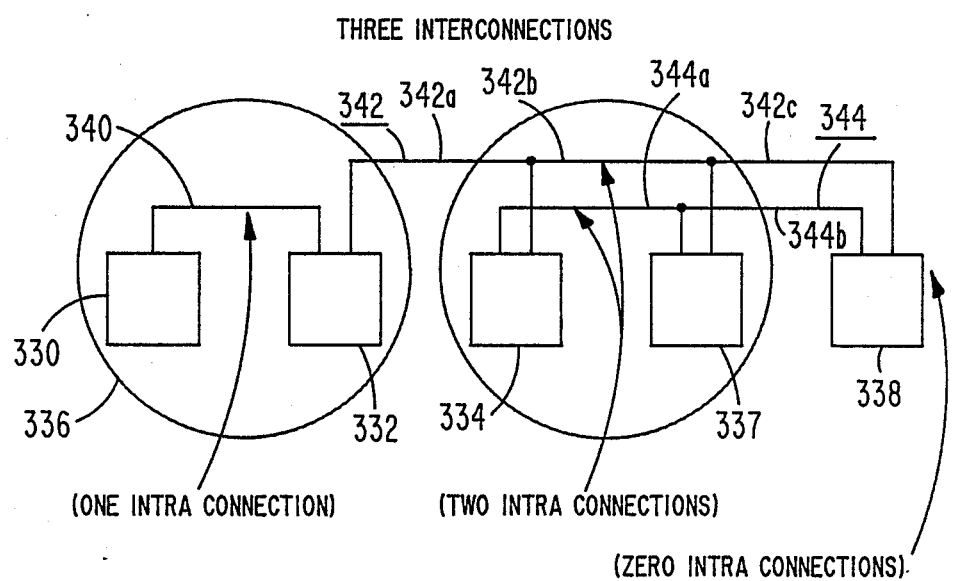

FIG. 3b illustrates the difference between interconnections and intraconnections. In FIG. 3b, logic elements 330 and 332 are grouped into a domain 336, and are interconnected by a net 340. Net 340 is termed an "intraconnection" because it is within domain 336. Logic element 332 is interconnected with further logic elements 334, 336, and 338 by a net designated generally as 342. Logic elements 334 and 336 are grouped into a domain 346. Net 342 includes a first portion 342a which extends from logic element 332 in domain 336 to logic element 334 in domain 346, and which is termed an "interconnection" because it interconnects domains. Net 342 includes a further connection 342b which extends from logic element 334 to logic element 336, both wholly within domain 346, and which is therefore an intraconnection. Net 342 includes a further connection portion 342c which interconnects logic element 336 with logic element 338, which is without domain 346, and connection 342c therefore constitutes an interconnection. Similarly, net 344 interconnects logic elements 334, 336, and 338. That portion 344a interconnecting logic elements 334 and 336, both lying within domain 346, constitutes an intraconnection, whereas that portion 344b interconnecting logic element 336 within domain 346 with logic element 338 without domain 346 is an interconnection.

Figure 4:
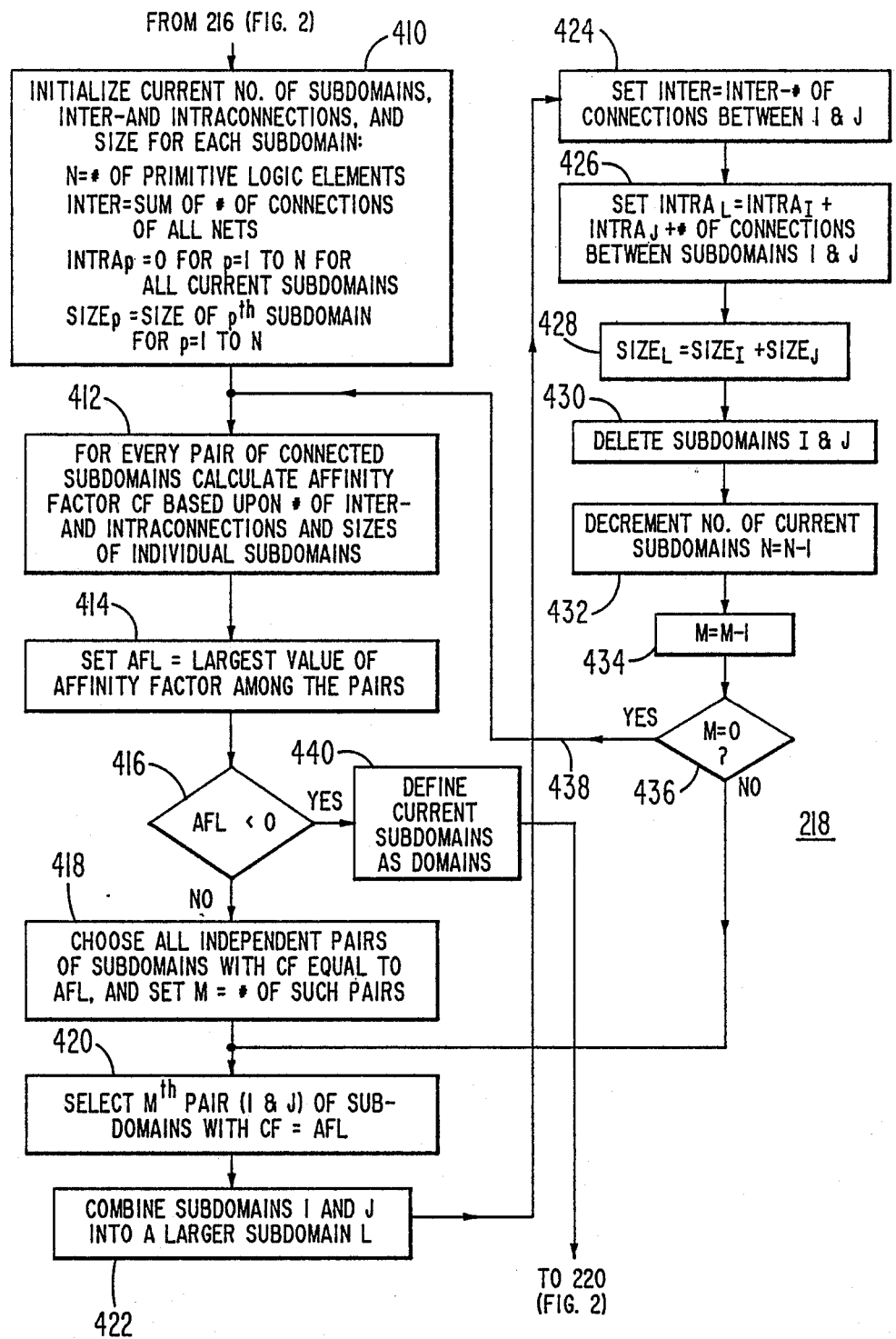
FIG. 4 is a more detailed flowchart of a portion of the flowchart of FIG. 2, relating to grouping of pairs of interconnected subdomains into subdomains of higher and higher order, based upon optimization of an affinity factor, until each subdomain becomes a domain.

FIG. 4 is a detailed flowchart illustrating the operation of block 218 of FIG. 2. In FIG. 4, completed information arrives at block 410 from initialization block 216. Block 410 represents initialization for the steps of FIG. 4. Step 410 includes the step of setting a running variable N equal to the number (#) of primitive logic elements to be placed in the layout. The number of logic elements N includes the number of standard cells but does not include the macrocells. Also in logic block 410, the variable INTER is set equal to the sum of the number of connections, including both interconnections and intraconnections, of all nets. A further variable INTRA$_p$ is set to zero for all value of p ranging from 1 to N. For ease of explanation, the logic elements (and the groupings of logic elements in additional steps described below) will be termed "subdomains" in order to distinguish them from domains and superdomains described in later stages of the process. A list is prepared of the areas of each of the subdomains currently existing (which at this first stage includes the areas of all standard cell elements) under the heading SIZE$_P$, which represents the area of the p$^{th}$ subdomain for all p ranging from p=1 to p=N. The logic then proceeds to a further block 412. Block 412 represents the calculation of affinity factors for every possible pair of connected subdomains. The calculation of affinity factor for every possible pair of connected subdomains is based upon the number of interconnections, the number of intraconnections, and the size of the individual subdomains which make up the pair of connected subdomains. The affinity factor is also known as the cost function (CF), and is expressed by Equation 1:

$$CF = (INTER - C) + \sum_{p=1}^{p=i-1} (INTRA_p \times SIZE_p) +$$

$$\sum_{p=i+1}^{p=j-1} (INTRA_p \times SIZE_p) + \sum_{p=j+1}^{p=N} (INTRA_p \times SIZE_p) +$$

$$(INTRA_i + INTRA_j + C) \times (SIZE_i + SIZE_j)$$

where:

N is the number of remaining elements, and equals the number of primitive logic elements at the first iteration;

INTER is equal to the sum of the number of connections including inter and intraconnections of all nets;

SIZE is the sum of the areas of all subdomains derived from SIZE$_p$ information;

C equals the number of intraconnections between the pair i, j of subdomains under consideration;

INTRA$_p$ is the number of intraconnections in the p$^{th}$ subdomain;

SIZE$_p$ is the size of the p$^{th}$ subdomain;

INTRA$_{i,j}$ is the number of interconnections in the i$^{th}$, j$^{th}$ subdomain under consideration; and SIZE$_{i,j}$ is the size of the i$^{th}$, j$^{th}$ subdomains under consideration.

Note that during the first iteration, when the intraconnections of the individual subdomains (i.e. the primitive logic elements) are zero, Equation 1 degenerates to Equation 2:

$$CF = (INTER - C) \times SIZE + (SIZE_i + SIZE_j) \times C$$

The affinity factor CF may have positive or negative values, and represents the advantage to be gained in overall size and path length by a combination of the elements into a pair. Once the affinity factor for each possible pair of connected subdomains has been prepared, the logic proceeds from block 412 to a further logic block 414, in which AFL (Affinity Factor Largest) is set equal to the largest (most positive) of the affinity factors found in the calculations in block 412. The logic then proceeds to a decision block 416 in which the value of the largest affinity factor is compared with zero. On initial iterations through the logic, all values of AFL will be positive. So long as the value of the largest affinity factor AFL remains positive, the logic remains within FIG. 4 and, as illustrated in FIG. 4, iteratively proceeds through a loop, reducing the positive value of the affinity factor with each pairing iteration. Decision block 416 compares AFL (the largest current value of the affinity factor) with zero, and so long as AFL is greater than zero, maintains the logic flow within the loop by directing the logic flow by the NO output to a further logic block 418.

Logic block 418 represents the selection of all independent pairs of subdomains having affinity factors equal to AFL. Pairs of subdomains having affinity factors equal to AFL which include a common logic element or subdomain are not independent. The logic must arbitrarily choose one of the two possible nonindependent pairs for further processing. A variable M is set equal to the number of pairs of independent subdomains having affinity factors equal to the current value of AFL. The logic proceeds from block 418 to a further block 420.

Logic block 420 is the first block of a logic loop which iteratively runs through all values from one to M, combining in pairs those interconnected logic elements and/or subdomain pairs having affinity factors equal to the current value AFL. Thus, block 420 represents, during the first iteration, the assignment of the first among the M possible pairs, and on the next following iteration represents the selection of the second among the M possible pairs, and so forth. To aid in describing further operation, the two logic elements or subdomains which are members of the M$^{th}$ pair are designated I and J. The logic proceeds to a further block 422, which represents the combination of the $M^{th}$ I and J subdomains or logic elements into a larger subdomain L. The logic proceeds to a further block 424 in which the variable INTER is updated to a value of INTER minus the number of connections between subdomains I and J. The variable INTER is used in Equation 1.

From block 424, the logic proceeds to a block 426, in which a variable $INTRA_L$ is set equal to the sum of $INTRA_I$ plus $INTRA_J$ plus the number of connections between subdomains I and J. The values of $INTRA_I$ and $INTRA_J$ were initially set to zero in block 410, together with the other $INTRA_p$. Thus, two lowest-level logic elements I and J are grouped into a subdomain L and are treated by the logic as being interconnected by a single net, meaning that they are thereafter treated as having a single intraconnection between them. In logic block 428, the variable $SIZE_L$ is set equal to $SIZE_I + SIZE_J$. This means that the size of the subdomain L is made equal to the size of the logic element pair I, J (or lower-level subdomain pair I, J, depending upon the iteration) which make it up. The logic proceeds to a block 430, which represents deletion of subdomains I and J from further calculation, because they have been grouped into subdomain L. Logic block 432 represents the decrementing of the current number of subdomains N by one, because of the grouping of I and J into L. Block 434 represents decreasing the number M of pairs being considered by one in the pairing loop. The logic then arrives at a decision block 436 in which the value of M is compared to zero. So long as any pairs remain unprocessed which have the affinity value AFL, the logic returns to block 420 by the NO path. Eventually, all of the pairs of logic elements or subdomains having affinity factor AFL will have been grouped into larger or higher-level subdomains, and the logic then leaves decision block 436 by a path 438 and returns to logic block 412. In block 412, all remaining pairs of connected subdomains once again have their affinity factor calculated, and block 414 selects the next largest or most positive value of affinity factor from among the calculated values. So long as the affinity factors remain greater than zero, decision block 416 causes the logic flow to continue in the processing as so far described in conjunction with FIG. 4. Eventually the affinity factor will become zero or slightly negative in value, at which time decision block 416 causes the logic to exit from decision block 416 by the YES output to a further block 440.

At this point in the processing, with the affinity factor having decreased to zero, there is no further advantage to grouping together of the subdomains because grouping results in a combination which is of larger size and increased interconnection length than if the subdomains were treated individually. However, up to this point in the processing, the macrocells have not been taken into account. As an aid in explanation, the standard cell domains remaining at this stage of the process are renamed as standard cell domains. Block 440 represents the identification of the remaining subdomains as domains. Each macrocell existing (all macrocells, until further combining occurs) is also defined as a domain. The logic leaves block 440 and flows to logic block 220 (FIG. 2).

Figure 5:
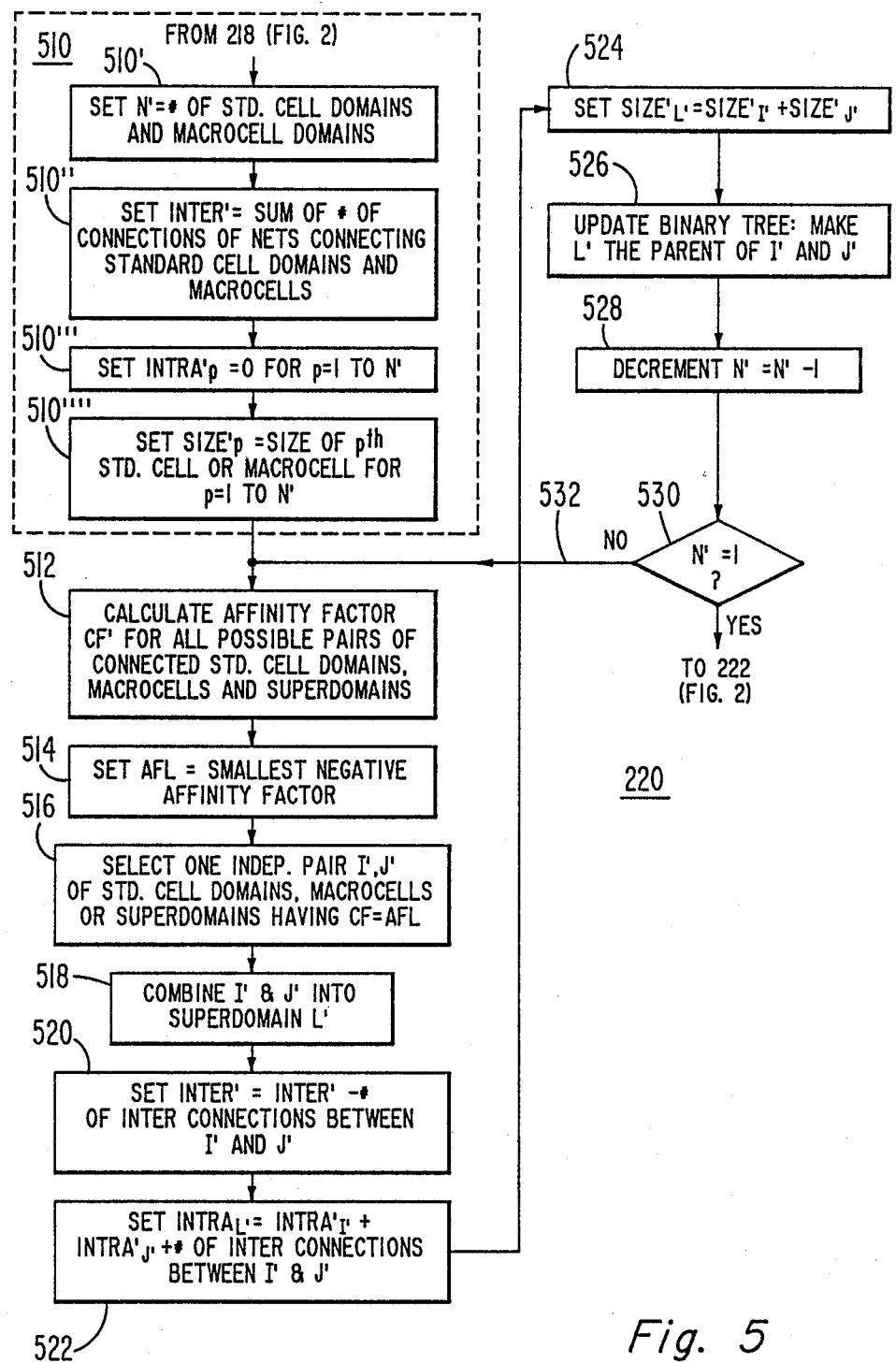
FIG. 5 is a more detailed flowchart of another portion of the flowchart of FIG. 2, relating to the grouping of pairs of interconnected domains and macrocells into superdomains of higher and higher order.

Logic block 220 of FIG. 2 is illustrated in detail in FIG. 5. In general, FIG. 5 represents the logic required for grouping of domains and macrocells into superdomains, and for the further grouping together of superdomains until only a single superdomain remains. This generates a binary tree structure, in which the lowest level leaves are standard cell domains and macrocells, and in which the root is the single remaining superdomain after all processing is completed.

In FIG. 5, logic block 510 represents generally the initialization of the variables to be used in the processing, and includes blocks 510' to 510''''. In block 510', a variable N' is set equal to the sum of the number of standard cell domains and macrocells to be processed. In block 510'', a variable INTER' is set equal to the sum of the number of connections of nets which connect any one of the standard cell domains with any other standard cell domain, any macrocell with a standard cell domain, or a macrocell with another macrocell. The variable $INTRA'_p$, representing the number of intraconnections for the $p^{th}$ domain or macrocell, is set equal to zero in block 510''' for all values of p ranging from 1 to N', that is, for all standard cell domains and macrocells. The variable $SIZE'_p$ is set equal to the area of the $p^{th}$ standard cell domain or macrocell in block 510'''' for values of p ranging from 1 to N', that is to say, for all remaining standard cell domains and macrocells. The logic flows from logic block 510 to a further logic block 512.

In logic block 512, the affinity factor is calculated, on the first iterative pass, for every possible pair of interconnected standard cell domains, macrocells, combinations of macrocells and domains, and on subsequent iterative passes, for every one of the above possible pairs, and also for pairings of superdomains with each other and with either a macrocell or a standard cell domain. For this purpose, a superdomain is the combination of two or more standard cell domains, the combination of one or more standard cell domains with one or more macrocells, or the combination of two or more macrocells. The affinity factor CF is given by Equation 3:

$$CF = (INTER' - C') + \sum_{p=1}^{p=i-1}(INTRA'_p \times SIZE'_p) +$$

$$\sum_{p=i+1}^{p=j-1}(INTRA'_p \times SIZE'_p) + \sum_{p=j+1}^{p=N'}(INTRA'_p \times SIZE'_p) +$$

$$(INTRA'_i + INTRA'_j + C') \times (SIZE'_i + SIZE'_j)$$

where:

N' is the number of cell domains and macrocells to be processed;

INTER' is total number of interconnections between all elements;

C' equals the number of interconnections between the pair i,j of standard cell domains, macrocells and/or superdomains under consideration;

$INTRA'_p$ is the number of intraconnections in the $p^{th}$ standard cell domain, macrocell or superdomain;

$SIZE'_p$ is the area of the $p^{th}$ standard cell domain, macrocell or superdomain;

$INTRA'_{i,j}$ is the number of intraconnections in the $i^{th}$, $j^{th}$ standard cell domain, macrocell or superdomain under consideration; and $SIZE_{i,j}$ is the area of the $i^{th}$, $j^{th}$ standard cell domain, macrocell or superdomain under consideration.

At the completion of the processing in block 512, the affinity factors of all possible combinations of standard cell domains, macrocells, and superdomains have been evaluated. The affinity factors, in practice, are always negative at this stage of processing. Block 514 represents the selection of the most positive value among the calculated values. If there are no actual positive values, the most positive value is the smallest or lowest negative value of affinity factor among all of the affinity factors calculated in block 512.

Logic block 516 differs from the corresponding logic block described in conjunction with FIG. 4, in that only one of the pairs having the lowest negative value of affinity factor is selected for further evaluation during the remainder of the iteration. The elements of the selected pair are designated I' and J'.

The logic them reaches block 518, which represents the combining (in the first pass) of domains or macrocells I' and J' into a superdomain L'. During subsequent passes, the elements being combined in pairs may include superdomains as well as domains and macrocells. In block 520, the value of variable INTER' is set equal to INTER' minus the number of interconnections between elements I' and J' of the pair under consideration. In block 522, variable INTRA'$_L$ is set equal to INTRA'$_{I'}$+INTRA'$_{J'}$ plus the number of interconnections existing between I' and J'.

In logic block 524, variable SIZE'$_{L'}$ is set equal to SIZE'$_{I'}$+SIZE'$_{J'}$. The values of variables developed in blocks 522, 524, and 526 are used in logic block 512 during the next iteration of calculations.

In block 526, the binary tree is updated by making L' the root or father node of domains, macrocells, or superdomains I' and J'. The binary tree is further explained in conjunction with FIG. 6, which illustrates an example of a binary tree. The running variable N'is decremented in block 528 of FIG. 5, and the logic flows to decision block 530, in which the current value of variable N' is compared with unity. If N' is greater than one, not all elements have been processed by pairing, and the logic flows from decision block 530 by way of the NO output and a logic path 532 back to block 512 to begin another iteration. Eventually, all elements are combined into one superdomain, and N' becomes unity. Decision block 530 then allows the logic flow to leave FIG. 5 by the YES output and proceed to block 222 of FIG. 2.

Figure 6:
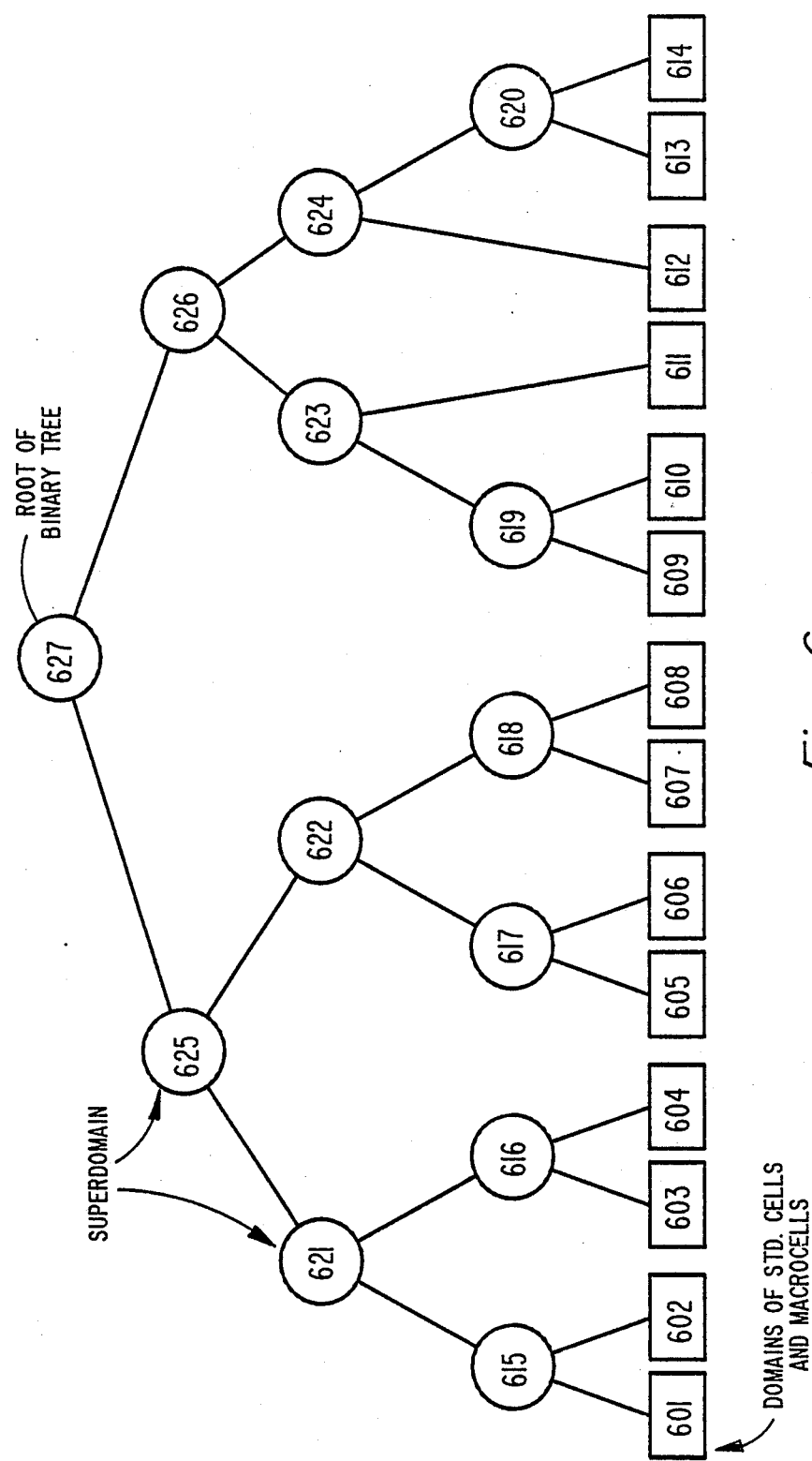
FIG. 6 is a depiction of a binary tree arising out of the operation of the flowchart of FIG. 5.

FIG. 6 illustrates a binary tree which may be constructed by the logic described in conjuction with the flowchart of FIG. 5. In FIG. 6, the lowest level of elements 601 to 614 are leaves or leaf nodes which are either domains of standard cell elements produced by operation of the logic circuit described in conjunction with FIG. 4, or macrocells. The next-to-the-lowest level of the binary tree of FIG. 6 (elements 615 to 620) represents superdomains formed from paired combinations of (a) macrocells, (b) standard cell domains, or (c) macrocells with standard cell domains. All elements of the binary tree of FIG. 6 above the lowest level are termed "superdomains." The tree of FIG. 6 is binary, because each element is composed of only two elements from the next lower level. Superdomain 627 is the root of the binary tree illustrated in FIG. 6. It is also the root or parent of leaves 625 and 626 of a subtree which includes elements 625, 626 and 627. Similarly, superdomain 625 is the root of a subtree which includes daughter superdomains 621 and 622.

Figure 19:
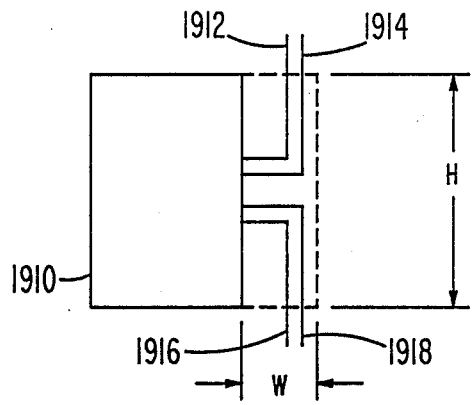
FIG. 19 illustrates a macrocell and adjacent wires to illustrate dimensions used for calculation of wire area.

Logic block 222 of FIG. 2 represents the estimation of the size and shape of the target surface or chip surface (strictly speaking, the layout proceeds with a target surface rather than a chip surface, which is represented by last block 26 of FIG. 1. The estimate of size or area is based upon summing together the areas of the macrocells and an estimated wire area for each macrocell to form a macrocell summed area, and summing together the areas of the standard cell domains and multiplying by a factor to take into account the estimated wire areas for each of the standard cell domains to form summed standard cell domain areas, and then adding together both the summed areas to form the estimate of the size of the target area. For this discussion, the inter and intraconnecting conductors are termed "wires," for ease of description, but those skilled in the art will understand that they may be formed as conductive paths formed on the surface of the integrated circuit chip. Referring now to FIG. 19, 1910 represents a rectangular macrocell on the target area. From the initial data, the number of wires associated with each side of the macrocell is known. As illustrated in FIG. 19, four wires 1912–1918 are associated with the right side of macrocell 1910. The assumption is made in forming the estimate of the requisite wire area that half of the total number of wires are routed in an upward direction and the remaining half are routed downward, as illustrated by the upward routing of wires 1912 and 1914, and the downward routing of wires 1916 and 1918. Consequently, the total area occupied by the wires on the right side of macrocell 1910 is the product of the height H of the macrocell multiplied by the width W of the wire channel. The width of the wire channel associated with the right side of macrocell 1910 is the product of the inter-wire pitch multiplied by the number of wires in the wiring channel. Naturally, wires entering the macrocell along the top or bottom of macrocell 1910 are assumed to be routed half to the left and half to the right. The wiring channel area is determined for all sides of the macrocell.

In the case of standard cells, the estimate of the wiring area is based upon historical estimates. A method which has been found to be effective uses two values, depending upon the total number of standard cell logic elements in the standard cell domain. For a number of standard cell elements in the domain less than 300, the area of the standard cells is calculated, and multiplied by 2.1 to get the total area of the standard cells plus the wiring area. For numbers of standard cells in excess of 300, the area is multiplied by 2.5 to get the total area.

Logic block 222 of FIG. 2 also represents estimation of the shape of the chip surface. The shape of the chip surface is accomplished by taking the square root of a quotient. The particular quotient is the quotient of the target area, calculated as described above, divided by the aspect ratio. The aspect ratio is the quotient of the target region height divided by the target region width, and is predetermined by the user information. It is desirable to provide a default value of 1.0 for the aspect ratio, if no aspect ratio is specified by the user. The height of the target region is simply the target area divided by the width of the target region.

Figure 7:
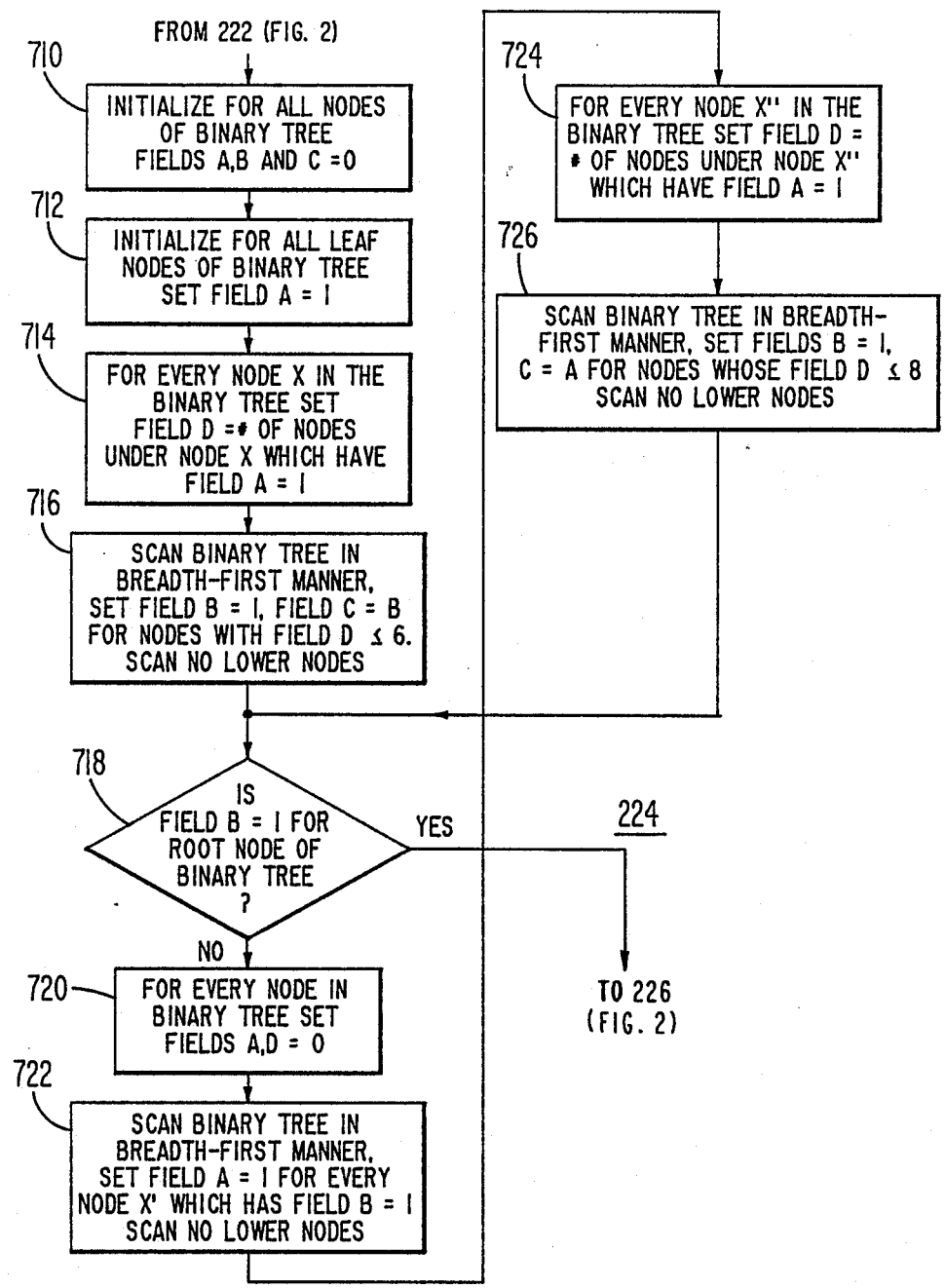
FIG. 7 is a more detailed flowchart which is a portion of the more general flowchart of FIG. 2, relating to subdivision of the binary tree of FIG. 6 into subtrees.

From block 222 of FIG. 2, the logic proceeds to a block 224 in which the binary tree is subdivided into type A and type B subtrees. FIG. 7 is a more detailed flowchart representing block 224. In general, the logic of FIG. 7 associates a digital word with each node of the binary tree. The word is divided into four fields designated A, B, C, and D. The A field identifies the node as a leaf node of the subtree (the lowest level node of any subtree). The A field of the digital word is assigned a logic zero level to indicate that it is not a leaf node, thus indicating that it has daughter nodes within the subtree, and the A field assumes a logic one level to indicate that it is a leaf node. The B field of the identification word includes a root flag indicative of the status of a node as a root of a subtree. A logic zero indicates that it is not a root, and a logic 1 indicates that it is a root. The C field identifies the subtree as a A or B subtree. The D field includes information relating to the number of leaves of the subtree.

In FIG. 7, blocks 710–716 identify the root nodes of type B subtrees. Block 710 initializes all nodes of the binary tree by setting the A, B, and D fields of the digital word equal to zero. Logic block 712 represents initialization for all leaf nodes of the binary tree by setting the A field equal to one. In effect, this takes the lowest-level leaves of the binary tree (601–614 of FIG. 6) and assigns them a leaf status. In block 714, field D is set, for every node X in the binary tree, equal to the number of nodes under node X which have field A set to one (thereby indicating its status as a leaf node). The logic flows from block 714 to a further block 716, which represents a scanning of the binary tree in a "breadth-first" manner, starting with the root node (627 of FIG. 6). The "breadth-first" processing requires that all subtrees at the same level of descent from the root are processed before any of the next lower-level subtrees are evaluated. During the breadth-first scanning starting with root node 627, block 716 also represents setting the field B flag (root-not root) equal to one and the field C flag (type A, B subtree) equal to B for all nodes in which the D field is less than or equal to the previously mentioned second predetermined number selected for B subtrees. In one embodiment of the invention, the second predetermined number is six. Once a particular node has been identified as the root node (field B=1) of a B subtree (field C=B), further scanning for root nodes in that particular subtree can be ended, which means that no lower-level nodes in that subtree are evaluated.

From block 716, the logic flows to a decision block 718. Block 718 is the beginning of a logic loop which completes its activity when the one root node of the binary tree (node 627 of FIG. 6) has its field B set equal to one, thereby indicating that it has been selected as the root node of a subtree. Decision block 718 examines the B field of the root node on each iteration, and directs the logic by the NO output to logic block 720 so long as root node 627 has not been so designated by setting field B equal to logic 1.

As mentioned, blocks 710–716 of FIG. 7 identify the root nodes of the type B subtrees. The iterative loop beginning at logic block 718 starts anew to identify the root nodes of the A subtrees. For this purpose, block 720, for every node in the binary tree set, sets fields A (leaf node ID) and D (number of subtree leaves) to logic zero. This eliminates identification of the leaf nodes and of the number of leaves under each node.

In block 722, the binary tree is again scanned in a breadth-first manner, and for every node which has a field B equal to one (that is, for each previously identified root of a B subtree on the first iteration or for identified roots of A or B subtrees on subsequent iterations), field A (leaf node ID) is set equal to one. Thus, the roots of a subtree of a particular level are made equal to leaves of subtrees of the next higher level. In block 722, scanning of the binary tree is stopped for all nodes which are the daughters of a node in which the field A has been set to one. This results in higher and higher level evaluations on subsequent iterations.

The logic flows from block 722 to logic block 724, in which the number of leaf nodes under each node X″ is counted, and for each node X″ in the binary tree, field D (number of leaves) is set equal to the number of nodes of which it is the parent or source, and which have field A (leaf node ID) set to one. Block 726 represents a scanning of the binary tree in a breadth-first manner and the setting of field B (root) to a value of logic one, and the setting of field C equal to A for those nodes in which the field D is less than or equal to the first predetermined number, which in the above-mentioned embodiment is eight. This makes a root node for a type A subtree out of those nodes having less than the predetermined number of leaves thereunder (nine in the example given above). Scanning of nodes below those nodes identified as roots of the A subtree ends, so that other daughter nodes are not incorrectly identified as root nodes. From logic block 726, the logic flow loops back to decision block 718 and iteratively traverses blocks 720–726. Eventually, when all root nodes have been identified, the logic leaves decision block 718 by the YES output and flows to block 226 of FIG. 2.

Figure 8:
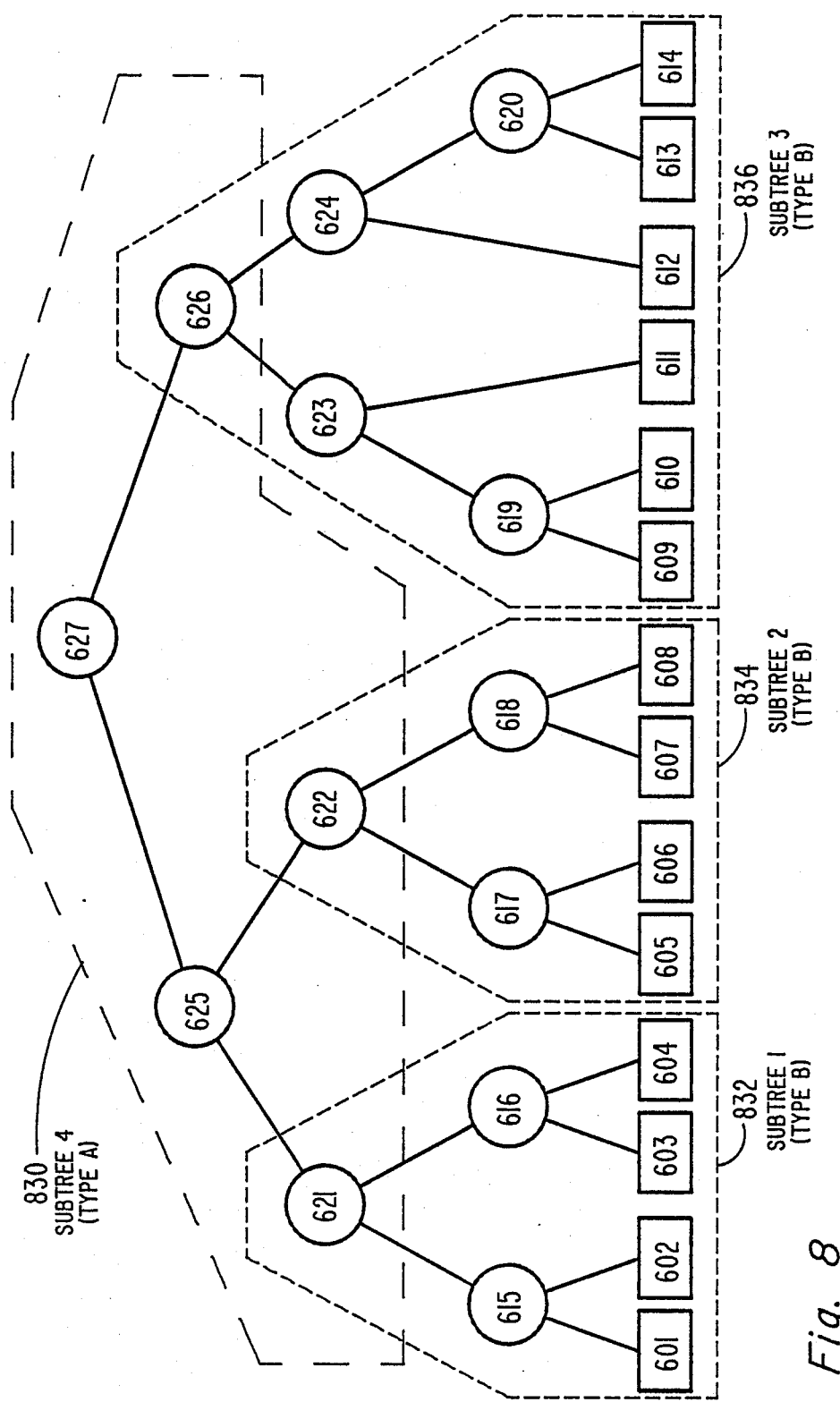
FIG. 8 illustrates the subdivision of the binary tree of FIG. 6 into type A and type B subtrees by the logic flow of FIG. 7.

FIG. 8 illustrates a binary tree similar to that of FIG. 6, subdivided into subtrees by the process described in conjunction with FIG. 7. Type A subtrees were required to have no more than eight leaf nodes, and type B subtrees were required to have no more than six leaf nodes in the processing. In FIG. 8, there is a single type A subtree, subtree 830. Also, there are three type B subtrees, 832, 834, and 836. Type B subtree 832 includes domains 601–604. These domains are combined into superdomains 615 and 616, and into higher level superdomain 621. If one were to attempt to extend subtree 832 to include any of domains 605–608, the subtree would have to include superdomain 625. However, if superdomain 625 were to be included in type B subtree 832, there would be a total of eight domains in the subtree (i.e., domains 601–608), which exceeds the allowable number, which is six. Type B subtree 836 includes domains 609–611, and if an attempt is made to extend subtree 836 to include domains 612–614, the subtree can be extended, thereby including superdomain 626, without exceeding the allowable number of six leaf nodes. Thus, superdomain 626 is the root of B subtree 836.

In the example of FIG. 8, only one type A subtree exists with leaf nodes 621, 622, and 626. Leaf nodes 621, 622, and 626 of the A subtree are root nodes of B subtrees 832, 834, and 836. Illustration of eight or more B subtrees, in order to illustrate more than one A subtree, would be difficult. Even if there were additional type B subtrees in FIG. 8, type A subtree 830 could be extended to include the root nodes of the additional type B subtrees, until a total of eight such root nodes were included. Further expansion would require an additional type A subtree of similar level and at least one higher-order subtree, to group the two lowest-level A subtrees.

From logic block 224 of FIG. 2, the logic proceeds to logic block 226 of FIG. 2, which represents the placement on the target surface of the leaf nodes of the binary tree. FIG. 9 illustrates details of the logic flow of block 226. Generally speaking, the logic of FIG. 9 starts at the root of the binary tree of FIG. 8 (node 627) and processes the highest level type A subtree first (subtree 830). The arrangement of FIG. 9 selects a subtree for evaluation, determines the type of subtree, and then directs the logic to the appropriate processing for that type of subtree. In FIG. 9, block 910 represents the selection of the next subtree in a "breadth first" manner, as defined above in conjunction with FIG. 7.

From block 910, the logic proceeds to a decision block 912 in which the type of subtree is evaluated. Type A subtrees are directed by the YES output to a further logic block 914, and the type B subtrees by default are directed to a logic block 916. The different logic processes for the type A and type B subtrees are described below. Once the processing is completed, the logic proceeds to a further decision block 918 to determine whether any subtrees remain to be processed. If subtrees remain to be processed, the logic leaves decision block 918 by the YES output and loops back to block 910, and the procedure is repeated. If all subtrees have been evaluated, the logic leaves block 918 by the NO output and proceeds to logic block 228 of FIG. 2.

Figure 10:
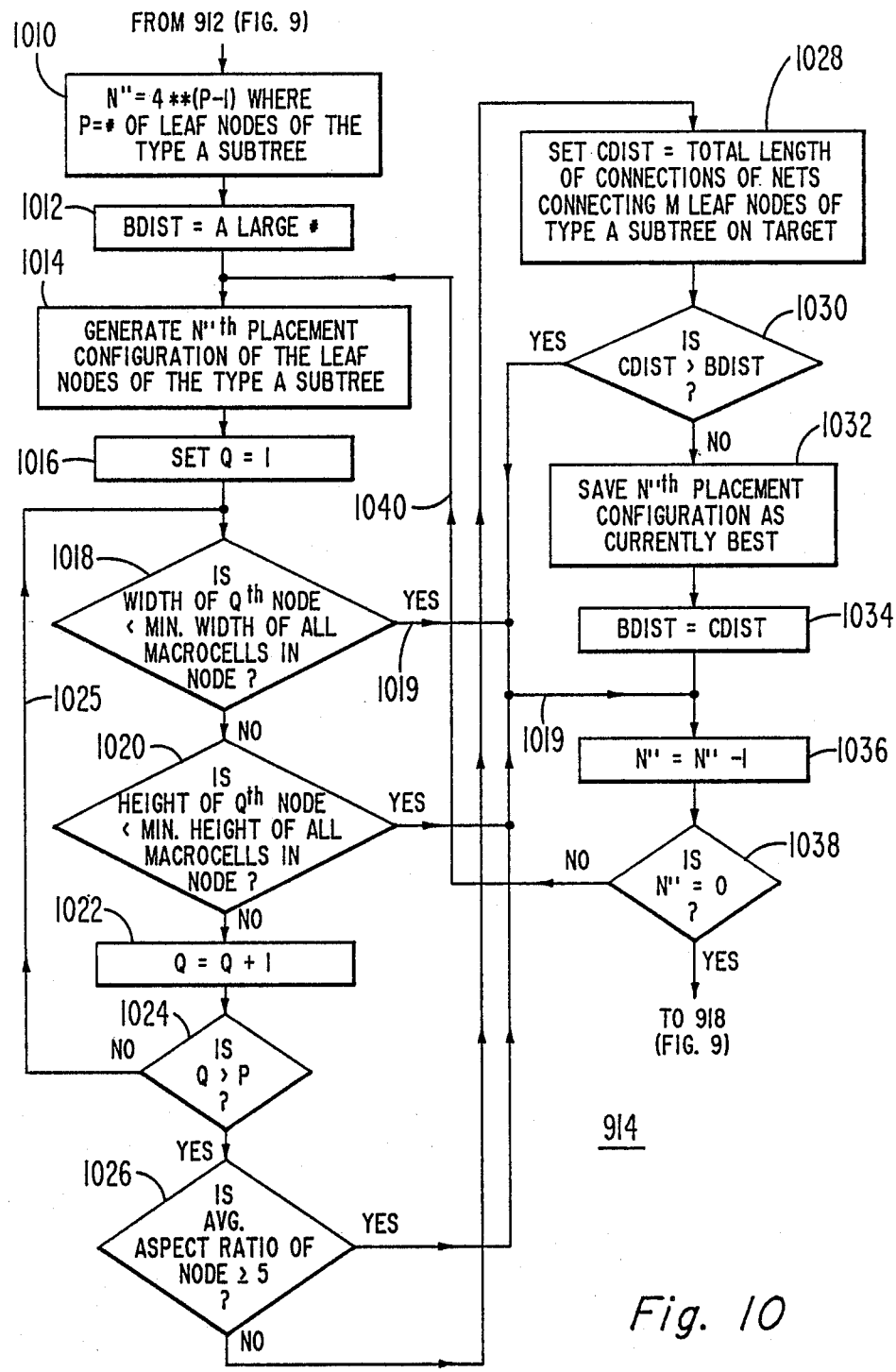
FIG. 10 is a detailed flowchart depicting a portion of the flowchart of FIG. 9 relating to type A subtrees.

FIG. 10 represents the processing required to process type A subtrees in block 914 of FIG. 9. The logic described in conjunction with FIG. 10 establishes relative physical locations for the elements of the superdomains which correspond to the leaf nodes of the A subtree by trying all possible placements of the various elements making up each leaf of the subtree.

In FIG. 10, initializing block 1010 initializes the value of $N''$ by setting it equal to $4^{(P-1)}$. The variable P is the number of leaf nodes of the type A subtree currently being processed. The number 4, which is the base of the exponent, represents the four possible permutation of right-left, top-bottom positionings of the two elements constituting each node. This is further described in conjunction with FIG. 11. The logic proceeds to a block 1012 in which the variable BDIST is set equal to an arbitrarily large number. Variable BDIST represents the best distance or length of the connecting net so far located, and the large number is a reference against which the number will be compared on a successive iterations. The logic then proceeds to block 1014. Block 1014 represents the generation of the $N''^{th}$ placement configuration for the leaf nodes of the type A subtree. That is, the $N''^{th}$ right-left, top-bottom permutation is generated. In block 1016, the value of a variable Q is set equal to unity. Q is a running variable, and is the designation applied to one of the P leaf nodes currently being evaluated.

Logic blocks 1016 through 1026 represent the logic required to evaluate the placement configuration currently being reviewed in order to determine if the calculated width and calculated height are sufficiently large to accommodate any macrocells (which as mentioned have fixed, invariant dimensions) contained therein. In block 1018, the width of the $Q^{th}$ node is compared with the minimum width of all macrocells included in superdomains corresponding to the $Q^{th}$ node. If the width of the $Q^{th}$ node is less than the width of any macrocell, then the configuration is invalid, and the logic flows by the YES output and a logic path 1019 to a logic block 1036, and by way of the NO output of a further decision block 1038 and a logic path 1040 to block 1014, to begin evaluation of another configuration. If, on the other hand, the width of the $Q^{th}$ node is greater than the width of any of the macrocells contained therein, decision block 1018 directs the logic by way of the NO output to a further decision block 1020. Decision block 1020 performs the same function for the height of the $Q^{th}$ node relative to the heights of the macrocells contained therein as block 1018 does for the widths. If the height of the $Q^{th}$ node is insufficient to accomodate the heights of the macrocells contained therein, the logic returns to consider another configuration by way of the YES output of block 1020, path 1019, blocks 1036 and 1038, and path 1040. If the configuration is valid as to both height and width, the logic proceeds from block 1020 by the NO output to a block 1022, in which Q is incremented to the value Q+1. The value Q+1 represents proceeding to the evaluation of a further node of the subtree. From logic block 1022, the logic proceeds to a decision block 1024, which compares Q with P. When Q=P, all the leaves of the subtree have been evaluated. So long as all of the leaves have not been evaluated, the logic returns by way of the NO output of decision block 1024 and a path 1025 to block 1018, in which the validity of a further node is evaluated.

Eventually, the validity of all the leaf nodes of the particular placement have been evaluated and the logic proceeds by way of the YES output of decision block 1024 to a further decision block 1026. Decision block 1026 attempts to reduce the number of situations in which the aspect ratio of any particular element in a placement configuration of the subtree has an aspect ratio which is undesirably large. This is done not by expressly prohibiting aspect ratios having a value exceeding a predetermined amount, but rather by averaging the aspect ratios of all leaf nodes of the subtree as placed, and comparing the average with a value of aspect ratio which is judged to be undesirably large. A value which has been found to be a satisfactory limit in this regard is an average aspect ratio greater than or equal to 5, but other values may be satisfactory for various purposes. If the average aspect ratio exceeds 5, the logic returns by way of the YES output of block 1026, and path 1019 to perform further evaluations. If the aspect ratio is less than 5, the NO output of decision block 1026 directs the logic to a further block 1028. In block 1028, the total current lengths or distances of the connections of nets connecting the leaf nodes of the type A subtrees being evaluated in the particular placement configuration are calculated and made equal to the variable CDIST. The logic proceeds to a decision block 1030, in which CDIST is compared with BDIST, the current best distance or length. If the newly calculated CDIST is greater than or equal to BDIST, the particular configuration being evaluated is less desirable than a previously calculated placement, and the YES output of decision block 1030 directs the logic by way of block 1036 and decision block 1038 back to block 1014 to evaluate another configuration. If CDIST is not greater than or equal to BDIST, the logic proceeds to a further block 1032, in which the desirable $N''^{th}$ placement configuraton is saved as being the best current configuration. The logic then flows to a further block 1034, in which variable BDIST is set equal to CDIST. The logic then flows to block 1036, in which the variable $N''$ representing the number of remaining unevaluated placement configurations of the type A subtree is reduced by one. The logic proceeds therefrom to decision block 1038, which comprares $N''$ with zero, and if configurations remain unevaluated, returns the logic to block 1014. Eventually, all the possible placement configurations of the type A subtree will have been evaluated, and the logic leaves FIG. 10 by the YES output of decision block 1038, and proceeds to block 918 of FIG. 9.

Figures 11, 11A:
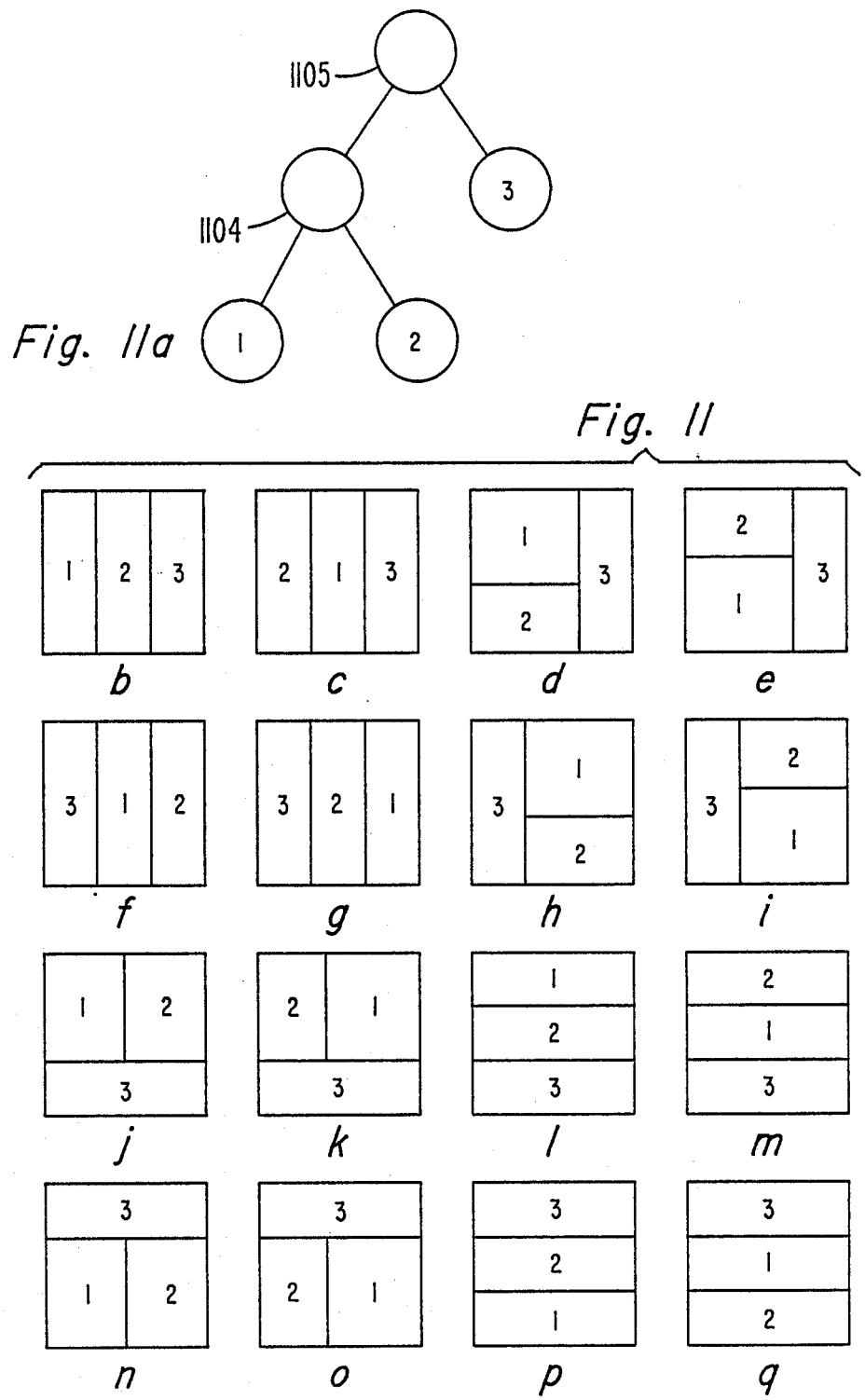
FIG. 11a represents a type A subtree with three leaves.

FIG. 11a represents a type A subtree with three leaf nodes numbered 1, 2 and 3. FIGS. 11b through 11q represent all possible variations or permutations of right-left, top-bottom placements of the three leaf nodes. As illustrated in FIGS. 11b-q, the aspect ratio of the target area of the root of the subtree happens to be square, but other aspect ratios are possible. Within the square target area, leaves 1, 2 and 3 can be placed side-by-side in that order, as illustrated by FIG. 11b, with their widths determined by their relative areas. FIG. 11c illustrates a permutation of the arrangement of FIG. 11b, with the positions of leaves 1 and 2 interchanged. FIG. 11f represents yet another permutation of right-left placement, and 11g represents the arrangement of 11f with the position of leaves 1 and 2 interchanged. A configuration in which leaf element 3 is interposed between leaf elements 1 and 2 cannot occur for the binary tree illustrated in FIG. 11a, because of the arrangement of the binary tree. That is, leaf nodes 1 and 2 are always combined right-left or top-bottom, relative to each other to form parent node 1104, and their combination as represented by node 1104 itself is arranged left-right or top-bottom relative to leaf node 3 to form the root node 1105.

FIG. 11d illustrates a top-bottom placement of nodes 1 and 2 to form a left grouping, and the combination of the 1-2 grouping with node 3 on the right. FIG. 11e is the same as FIG. 11d with the positions of nodes 1 and 2 interchanged. FIG. 11h is similar to FIG. 11d, but with node 3 on the left rather than on the right. FIG. 11i is similar to FIG. 11e, but with node 3 on the left rather than on the right. FIG. 11j illustrates a left-right configuration of leaves 1 and 2, both placed above or on top of node 3, and FIG. 11k is the same as 11j but with the positions of nodes 1 and 2 interchanged right-left. FIG. 11l illustrates a vertical placement of leaves 1, 2 and 3, in that order, and FIG. 11m is similar but with the positions of leaves 1 and 2 reversed. FIG. 11n illustrates a placement similar to 11j, but with 3 at the top rather than at the bottom of the group 1-2 combination. FIG. 11o is a similar permutation of FIG. 11k. FIG. 11p is a 1, 2, 3 bottom-to-top placement of the leaves, and 11q is similar, but with 1 and 2 interchanged. As so far described, the various right-left, top-bottom layout permutations illustrated in FIG. 11 were generated by branch 914 of FIG. 9.

The leaves of the A subtree as so far described have relative positions, but do not have dimensions associated with their target areas. When all the leaves of the A subtrees have been placed and evaluated, the procedure continues to include the next lower level of the binary tree, which includes the lowermost leaves, which are the domains. This step applies actual dimensions to the leaf nodes of the A subtree, which are the root nodes of the B subtrees. This is done by placing the leaf nodes of the B subtrees (elements 601-614 of FIG. 8) within the roots of the B subtrees (601-604 within 622, 605-608 within 623, etc.). This is accomplished in block 916 of FIG. 9.

Figure 12:
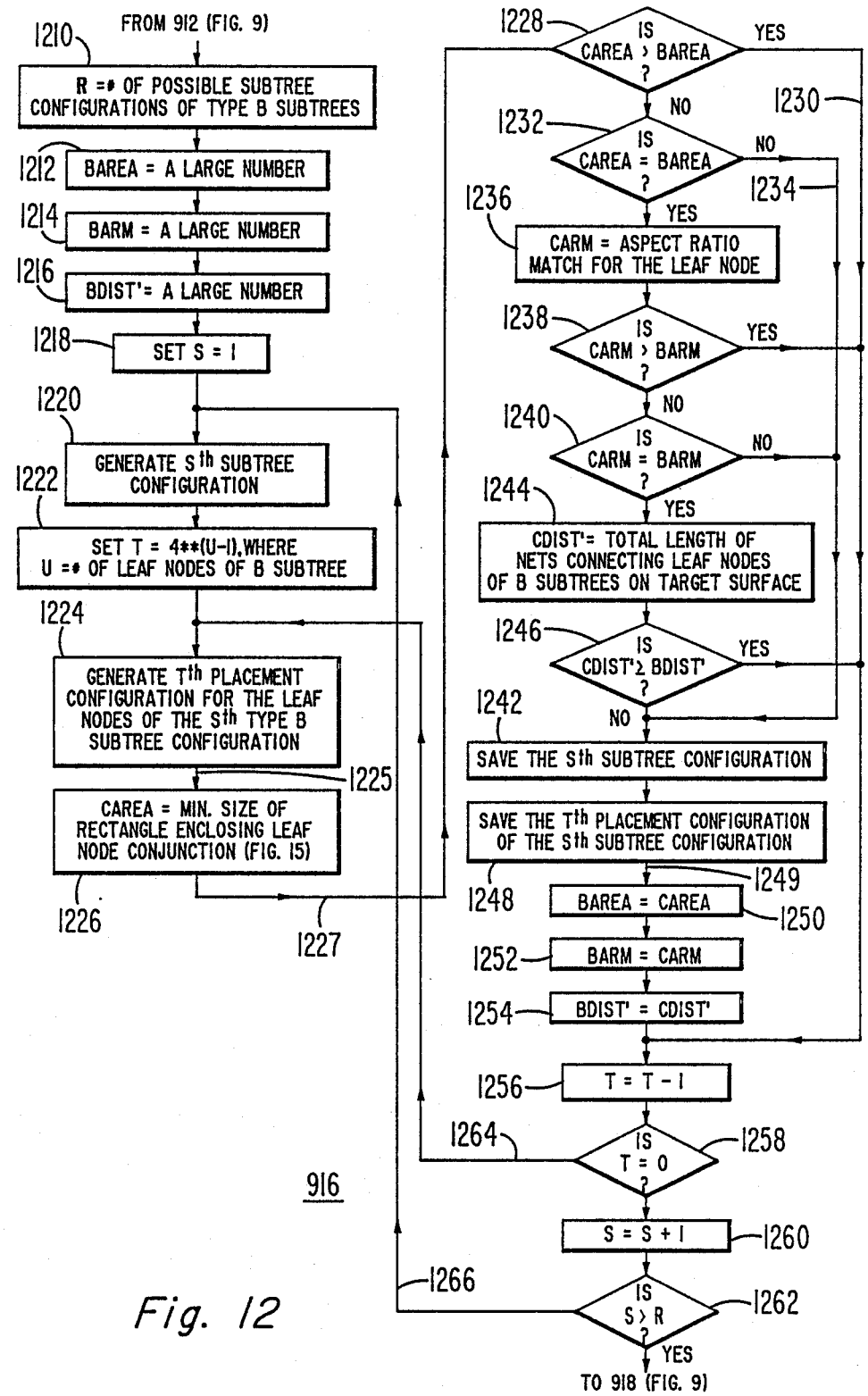
FIG. 12 is a more detailed flowchart of a portion of the flowchart of FIG. 9, relating to type B subtrees.

FIG. 12 is a detailed flow diagram of the logic represented by logic block 916 of FIG. 9. In block 1210, the variable R is set to equal the number of possible subtree configurations for the type B subtree. This done according to Equation 4:

$$R = (1)(3) \ldots ([A-1][A-2]/2)([A][A-1]/2)$$

where A is the number of leaves of the B subtree under consideration.

Figure 13:
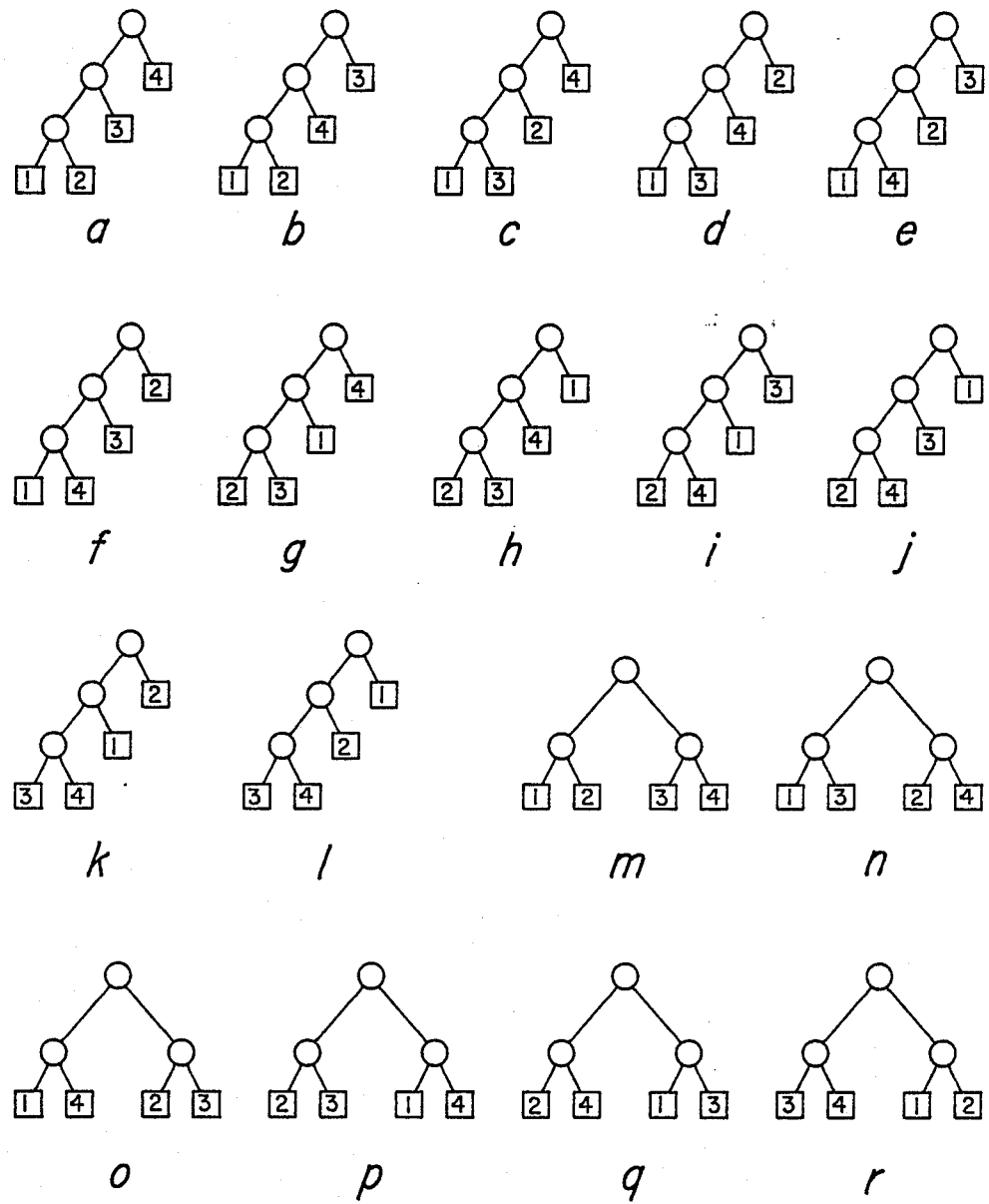
FIGS. 13a–13r, referred to jointly as FIG. 13, illustrate the type B binary subtree configurations which are evaluated by the flowchart of FIG. 12 when the subtree has four leaves.

FIG. 13 illlustrates all possible subtree configurations (as opposed to placement configurations) for type B subtrees with four leaf nodes. The leaf nodes are numbered 1, 2, 3 and 4 and are placed in rectangles, and parent nodes are illustrated as circles. There are 18 such possible trees, even with only four nodes. There are many right-left, top-bottom placement configurations for each of the illustrated possible subtrees. No further explanation of FIG. 13 is believed necessary.

From block 1210 of FIG. 12, the logic proceeds to a block 1212. The variable BAREA, representing the best or least area so far found, is set equal to a large number. In logic block 1214, BARM, representing the best aspect ratio match factor, is set equal to a large number. The logic then flows to a block 1216, in which BDIST' is set equal to a large number. The logic then flows to a block 1218 in which a variable S is set equal to unity. S is a running variable used to keep track of how many configurations of B subtrees have been evaluated by the loop.

In block 1220, the $S^{th}$ subtree configuration is generated. As mentioned, FIG. 13 illustrates all possible subtree configurations for a type B subtree with four leaf nodes. Generally speaking, the logic associated with FIG. 12 generates all possible forms of subtree which can be generated with the given number of leaf nodes, and then for each of the possible configurations performs an evaluation of placement such as that described in conjunction with FIG. 11. Thus, the amount of computation required in the flowchart of FIG. 12 to perform the evaluations of FIGS. 13 and 11 greatly exceeds that which was required in the flow chart of FIG. 10 in order to perform the evaluation described in conjunction with FIG. 11. It is for this reason that the number of leaf nodes in a B subtree is maintained below the number of leaf nodes of the A subtrees. By controlling the number of leaf nodes in this fashion, the amount of computation for each type of subtree is comparable.

In block 1222, the variable T is set to the value $T = 4^{U-1}$ written as 4**(U−1), where U is the number of leaf nodes of the type B subtree. This equation is similar to the equation evaluated in block 1010 of FIG. 10, but with different variable names to avoid confusion. From block 1222, the logic enters a loop which evaluates all possible placement configurations for one of the binary subtree configurations. This loop begins with block 1224, which generates the $T^{th}$ placement configuration for the leaf nodes of the $S^{th}$ subtree configuration of the the B subtree being evaluated. Block 1226 calculates variable CAREA, which is the area of the minimum sized rectangle which encloses the assembly of leaf nodes currently being evaluated. The calculation of CAREA is further detailed in conjunction with FIG. 15. From block 1226, the logic flows to a decision block 1228 in which CAREA is compared with variable BAREA. If the current area CAREA is greater than the best previous area, as measured by variable BAREA, the placement configuration is not satisfactory and is not considered further. In that event, the logic leaves decision block 1228 by the YES output and flows by a path 1230 to a block 1256 near the end of the loop for selection of another configuration and another attempt. However, if the current area CAREA is less than the previous best area, the logic leaves decision block 1228 by the NO output and flows to a further decision block 1232, in which CAREA is compared with BAREA. If CAREA is not equal to BAREA, this indicates the currently evaluated configuration is the best possible configuration among those tested, and this configuration is saved by taking logic path 1234 from the NO output of decision block 1232 to logic block 1242. On the other hand, if CAREA equals BAREA, further evaluation is performed in a block 1236. In block 1236, a variable CARM is set equal to the aspect ratio match factor for the assembly of leaf nodes of the type B subtree. Aspect ratio match is calculated according to Equation 5:

$$ARM = 2 - (R_Y + R_X)$$

where
$$R_Y = Y_T/Y_A \text{ or } Y_A/Y_T, \text{ and } R_X = X_A/X_T \text{ or } X_T/X_A$$

selected so that $(R_X)(R_Y) \geq 1$,
where:
$X_A$ and $Y_A$ are the X and Y dimensions, respectively, of the target area of the root node of the type B subtree, and
$X_T$ and $Y_T$ are the actual X and Y dimensions, respectively, of the root nodes in the particular placement being evaluated, as illustrated in FIG. 14.

If the target area dimensions and actual dimension correspond, $Y_T/Y_A = 1$, and $X_A/X_T = 1$, whereupon $ARM = 2 - (1+1) = 0$. This is the perfect aspect ratio match. Therefore, best aspect ratio match corresponds to the lowest value of ARM.

Figure 14A:
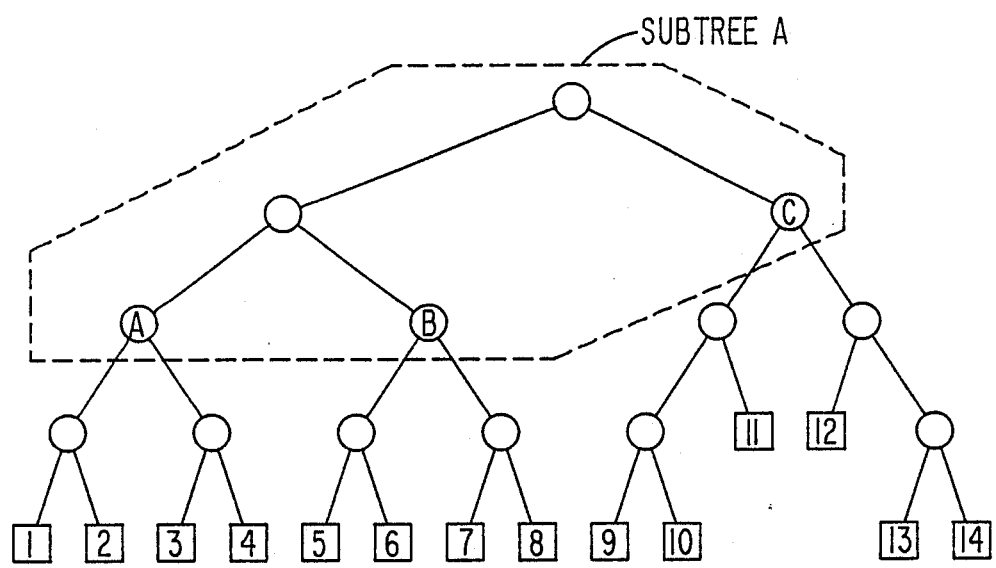
Figure 14B:
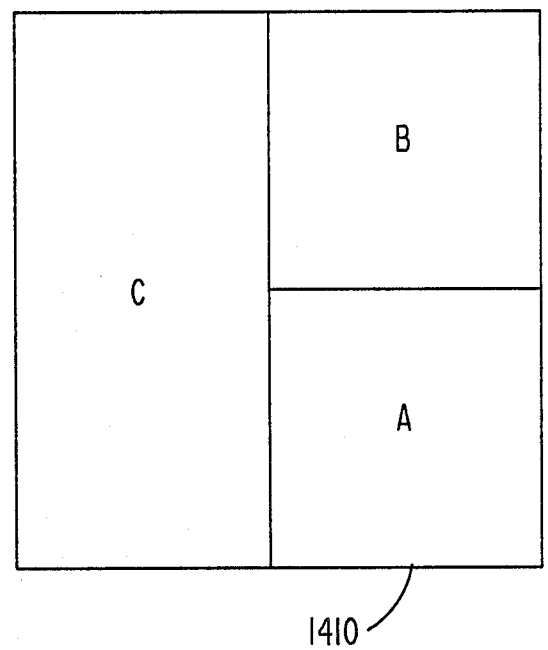

FIG. 14a illustrates the A subtree which is being evaluated, and FIG. 14b illustrates an example of a possible placement of the A, B and C leaf nodes of the A subtree. FIG. 14c illustrates one possible current configuration of the placement of the leaf nodes of the B subtree associated with the A leaf node of the A subtree. In FIG. 14c, domains 1401, 1402, 1403 and 1404 are being placed in target area 1410, corresponding to the A leaf node of the type A subtree of FIG. 14a. In the particular placement configuration here illustrated, 1401 is a standard cell domain to the left of macrocell domain 1402, and macrocell domain 1403 is to the left of macrocell domain 1404. The combination of 1403 and 1404 is at the top of the combination of 1401 and 1402. Since the areas and aspect ratios of the domains are already known, the aspect ratio of their combination in relationship to the aspect ratio of target area 1410 can be determined according to Equation 5.

After the evaluation of aspect ratio in logic block 1236 of FIG. 12, the logic flows to a decision block 1238 in which the current aspect ratio match CARM is compared with the previous best aspect ratio match BARM. If CARM is greater than BARM, the present configuration is not as good as a previously evalauted one, and the logic flows by the YES output of decision block 1238 and by path 1230 to begin another iteration. If CARM is not greater than BARM, the logic flows from decision block 1238 by the NO output to a further decision block 1240, in which CARM is again compared with BARM. If CARM is not equal to BARM, then it must be less than BARM and consequently the configuration is better than any previously evaluated configuration. In this event, the logic flow from decision block 1240 by the NO output to path 1234, bypassing blocks 1244 and 1246. If the current aspect ratio match equals the previous best aspect ratio match, the best configuration cannot be determined without further processing, in which case the logic leaves decision block 1240 by the YES output to a further block 1244, which computes the length CDIST' of nets connecting the leaf nodes of the type B subtree in the particular placement configuration, and the logic flows to a further decision block 1246. In block 1246, the current length CDIST' is compared with the previous best distance BDIST'. If CDIST' is greater than or equal to BDIST', the configuration is less satisfactory than one previously evaluated, the logic flows by the YES output and path 1230 to the end of the iteration loop. If CDIST' is not greater than or equal to BDIST', the NO output of decision block 1246 directs the logic to block 1242.

As mentioned, block 1242 represents the saving of the $S^{th}$ subtree configuration as the best one so far evaluated. Block 1248 saves the $T^{th}$ placement configuration of the $S^{th}$ subtree configuration as the best.

From logic block 1248, the logic flows by a path 1249 to a further block 1250, representing the setting of the current value of BAREA to equal the newly found CAREA. Block 1252 represents the setting of variable BARM equal to CARM, and block 1254 represents the setting of HDIST' equal to CDIST'. Block 1256 reduces the value of variable T by unity, representing the reduction by one of the number of remaining placement configurations within a subtree configuration. Decision block 1258 compares the current value of T with zero to determine whether or not all the placement configurations (variations of T) of a particular subtree configuration have been evaluated. If not, the logic returns by a path 1264 to block 1224. Once all the placement configurations for a particular subtree have been evaluated, T becomes zero, and decision block 1258 directs the logic to a further block 1260, in which the value of S is incremented, and decision block 1262 compares the current value of S with R, the maximum possible number of subtree configurations. If S has not reached R, the logic flows by the line 1266 back to block 1220 to begin evaluation of another subtree. Eventually, all subtrees are evaluated and the logic flows from decision block 1262 to block 918 of FIG. 9.

Figure 15A:
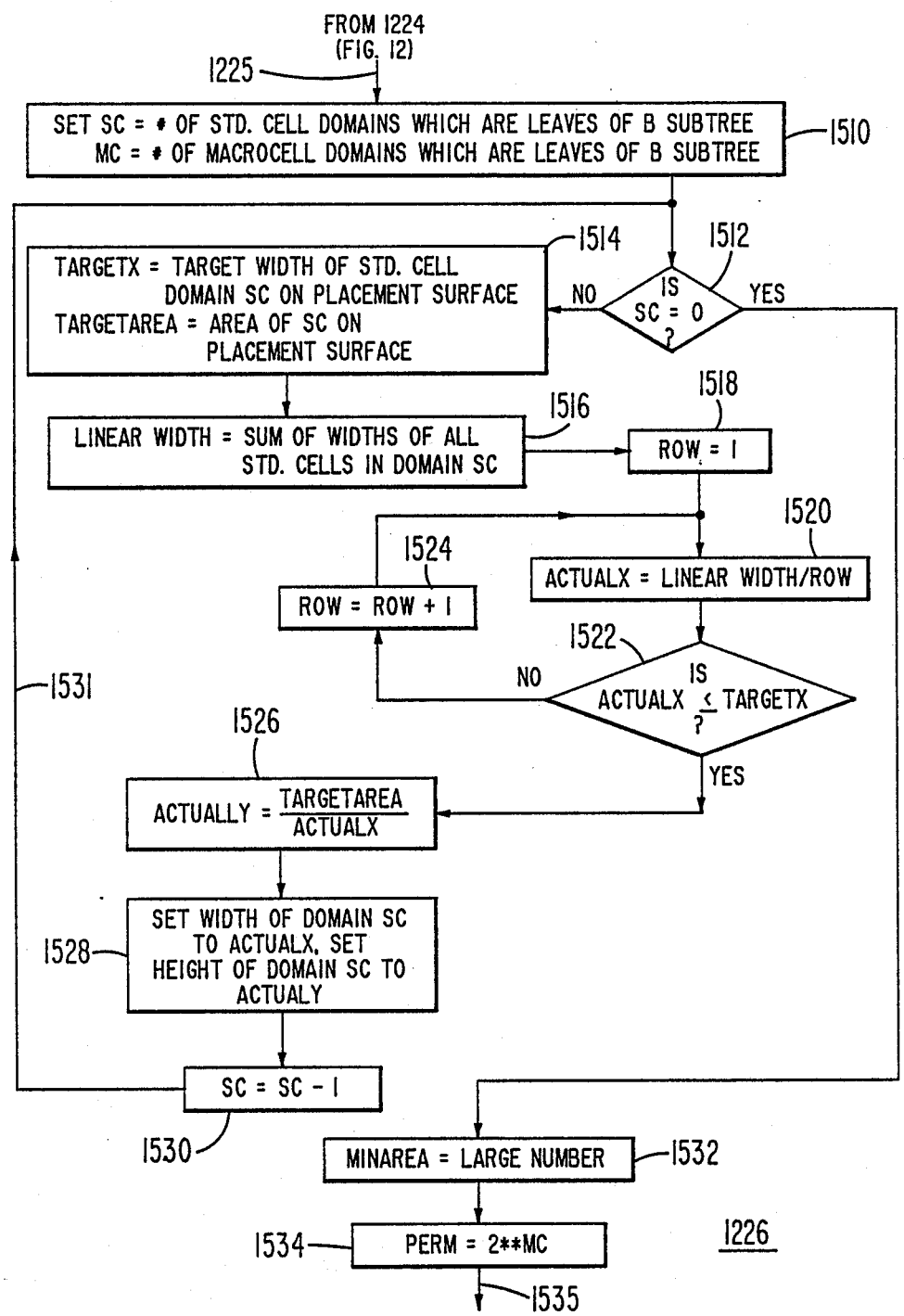
FIG. 15 is a more detailed flowchart which is a portion of the flowchart of FIG. 12 for selecting aspect ratios of standard cell domains and for selecting macrocell orientations for minimum area.
Figure 15B:
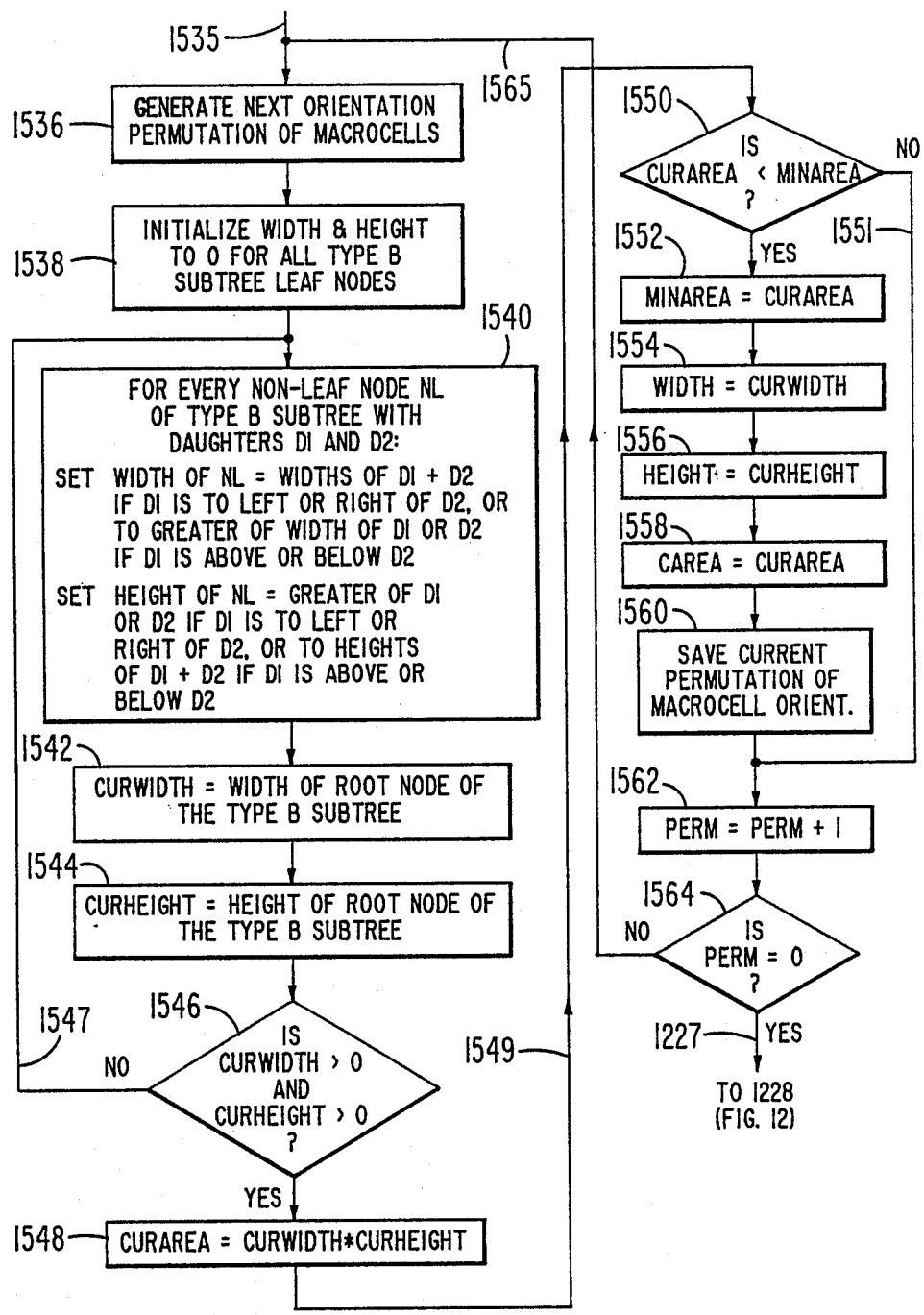

FIG. 15 illustrates details of the logic flow within block 1226 of FIG. 12. Block 1510 represents a setting of a variable SC to equal the number of standard cell domains in each leaf node of the type B subtree being evaluated, and also the setting of a variable MC equal to the number of macrocells which are leaves of the B subtree. The logic then flows to a decision block 1512, which is part of a logic loop. This iterative loop, for each standard cell domain, determines the number of rows of standard cells contained therein, which ultimately establishes the aspect ratio of the standard cell domain being placed. Decision block 1512 compares the value of variable SC with zero, to determine when processing has been completed. So long as processing remains to be done, the logic flows to block 1514 by way of the NO output of decision block 1512. In block 1514, a variable TARGETX is set equal to the target width of standard cell domain SC on the placement surface.

Referring to FIG. 14c, standard cell domain 1401 is illustrated as including three rows of standard cells 1414, 1416, and 1418, and as having a width TARGETX. While three rows of standard cells are illustrated in standard cell domain 1401, it should be emphasized that the logic loop of FIG. 15 is intended to establish the number of rows required for the target aspect ratio by beginning with all standard cells in one row, and progressively increasing the number of rows until the actual width of the standard cell domain is equal to or less than the width of the target area.

Block 1514 also sets a variable TARGETAREA equal to the area of standard cell domain SC (1401 of FIG. 14c) on the placement surface. From block 1514, the logic flows to a block 1516. In block 1516, a variable LINEARWIDTH is set equal to the sum of the widths of all standard cells in domain SC. From block 1516, the logic flows to a block 1518, which sets a variable ROW equal to one. The logic then enters a loop beginning with the block 1520, in which the number of rows is progressively increased and the resulting width is evaluated. From logic block 1518, the logic flows to a block 1520, in which a variable ACTUALX is set equal to the quotient of the variable LINEARWIDTH divided by variable ROW. In decision block 1522, variable ACTUALX is compared with TARGETX, and so long as ACTUALX exceeds TARGETX, the logic flows by way of the NO output of block 1522 to a further block 1524, in which variable ROW is incremented, and the logic return to block 1520. The iterations of the loop including blocks 1520, 1522, and 1524 continually increments the number of rows until the actual width of the standard cells decreases below the available width of the TARGETAREA. Once the number of rows has been established, the logic leaves block 1522 by way of the YES output to a further block 1526, which sets a variable ACTUALY equal to the quotient of variable TARGETAREA divided by variable ACTUALX. This block simply determines the actual height of the standard cell domain, knowing the area and the width. Block 1528 sets the width of domain SC equal to ACTUALX, and sets the height of domain SC to ACTUALY. The logic them flows to a further block 1530, in which variable SC is decremented, and the loop returns to decision block 1512. This loop continues until all standard cell domains which are leaves of the B subtree are evaluated. Once the dimensions of all of the standard cell domains have been determined, the logic leaves decision block 1512 by the YES output and flows to a further block 1532.

The portion of the logic of FIG. 15 extending from logic block 1532 to logic block 1564 is intended to select the appropriate rotational position of the macrocells. Prior logic has determined the actual dimensions of the standard cell domains, and the fixed dimensions of the macrocells are also known. However, the rotational positioning of the macrocells can be selected. There are two allowable rotational positions of each macrocell, zero degrees and 90 degrees. For each possible position of each macrocell, each of the other macrocells may take one of two positions. The total number of possible permutations of the zero degree, 90 degree positions of the macrocells equals $2^{MC}$. Generally speaking, the logic extending from blocks 1532 to 1564 tries each possible rotational permutation and calculates the overall area. The overall area may change with changes in the rotation of a macrocell, because the dimensions of the standard cell domains change accordingly. That one positioning arrangement of the macrocells which minimizes the area is selected.

In Block 1532, a variable MINAREA is set equal to a large number, and in block 1534 a further variable PERMutation is set equal to $2^{MC}$. The logic flows to a further block 1536 which generates the next permutation of the zero degree, 90 degree rotation of the macrocells. Block 1538 initially sets the width and height of all non-leaf nodes of the type B subtree equal to zero. The widths and heights of these non-leaf nodes will be updated further on in the loop. From block 1538, the logic flows to a block 1540.

In block 1540, the area of each non-leaf node NL, which is the parent of two daughter nodes, is evaluated by setting the width and height of NL. The width of a node NL is equal to the sum of the widths of the daughter nodes if the daughter nodes are placed left-right. If the daughter nodes are placed top-bottom, the width of parent node NL is the width of that daughter node which has the greatest width. Also in block 1540, the height of parent node NL is established. The height of parent node NL is the sum of the heights of the two daughter nodes, if the daughter nodes are in a top-bottom configuration. If the daughter nodes are in a side-by-side configuration, the height of the parent node equals the greater of the heights of the daughter nodes. From block 1540, the logic flows to a further block 1542, in which the current width is set by setting a variable CURWIDTH equal to the widths of the root nodes of the type B subtree, as determined by repeated iterations through block 1540. Block 1544 sets the current height by setting a variable CURHEIGHT equal to the height of the root nodes of the type B subtree. A decision block 1546 forces iterative passes through blocks 1540, 1542 and 1544 by way of path 1547 so long as the root node dimensions are not greater than zero, indicating that the root node of the B subtree has not yet been calculated. Eventually, the root node area will be established and the logic exits block 1546 by the YES output path.

Block 1548 establishes the current area by setting variables CURAREA equal to the product of the variables CURWIDTH multiplied by CURHEIGHT. Decision block 1550 compares current area with the MINAREA, and if the currently calculated area is less than the previously calculated MINAREA, the logic flows by the YES output to block 1552. If the currently calculated area is greater than MINAREA, there is not need to save the current permutation, and the logic flows by the NO output of decision block 1550 and by way of a path 1551 to block 1562.

In block 1552, the value of MINAREA is updated to equal CURAREA. In block 1554, variable WIDTH is set equal to CURWIDTH, and variable HEIGHT is set equal to CURHEIGHT in block 1556. In block 1558, variable CAREA is set equal to CURAREA. Variable CAREA is used in FIG. 12. The logic flows to a block 1560, which represents the saving of the current permutation of the orientation of the macrocells. The number of permutations is decremented by one in block 1562, and the variable PERM is compared with zero in a decision block 1564. So long as variable PERM is greater than zero, the logic loops by the NO output and path 1565 back to block 1536. When all permutations have been evaluated, the logic flows from decision block 1564 to block 1226 of FIG. 12.

As so far described, all the leaf nodes of the A and B subtrees of the binary tree have been placed, together with dimensions assigned to the root nodes of the type subtrees. The next step, accomplished in block 228 of the logic flow of FIG. 2, prunes the type B subtrees, except for their root nodes, from the remainder of the binary tree structure. The logic flow contained within block 228 of FIG. 2 is detailed in FIG. 16. In FIG. 16, block 1610 represents the sequential selection of subtrees beginning with the highest order subtrees and proceeding in a breadth-first manner, as described above, to lower-order subtrees. In decision block 1612, the type of subtree is identified. If it is not a type A subtree (i.e., if it is a B subtree), the logic proceeds to block 1614 in which every node of the type B subtree except for the root node is deleted. The logic then flows to decision block 1616. On the other handd, if the subtree is identified in decision block 1612 as being a type A subtree, the logic flows directly to decision block 1616. In decision block 1616, the need to process further subtrees is established, and when further subtrees are to be processed, the logic loops by way of the YES output back to block 1610. When all of the subtrees have been evaluated and pruned as required, the logic flows from the NO output of decision block 1616 to decision block 230 of FIG. 2.

Figure 17:
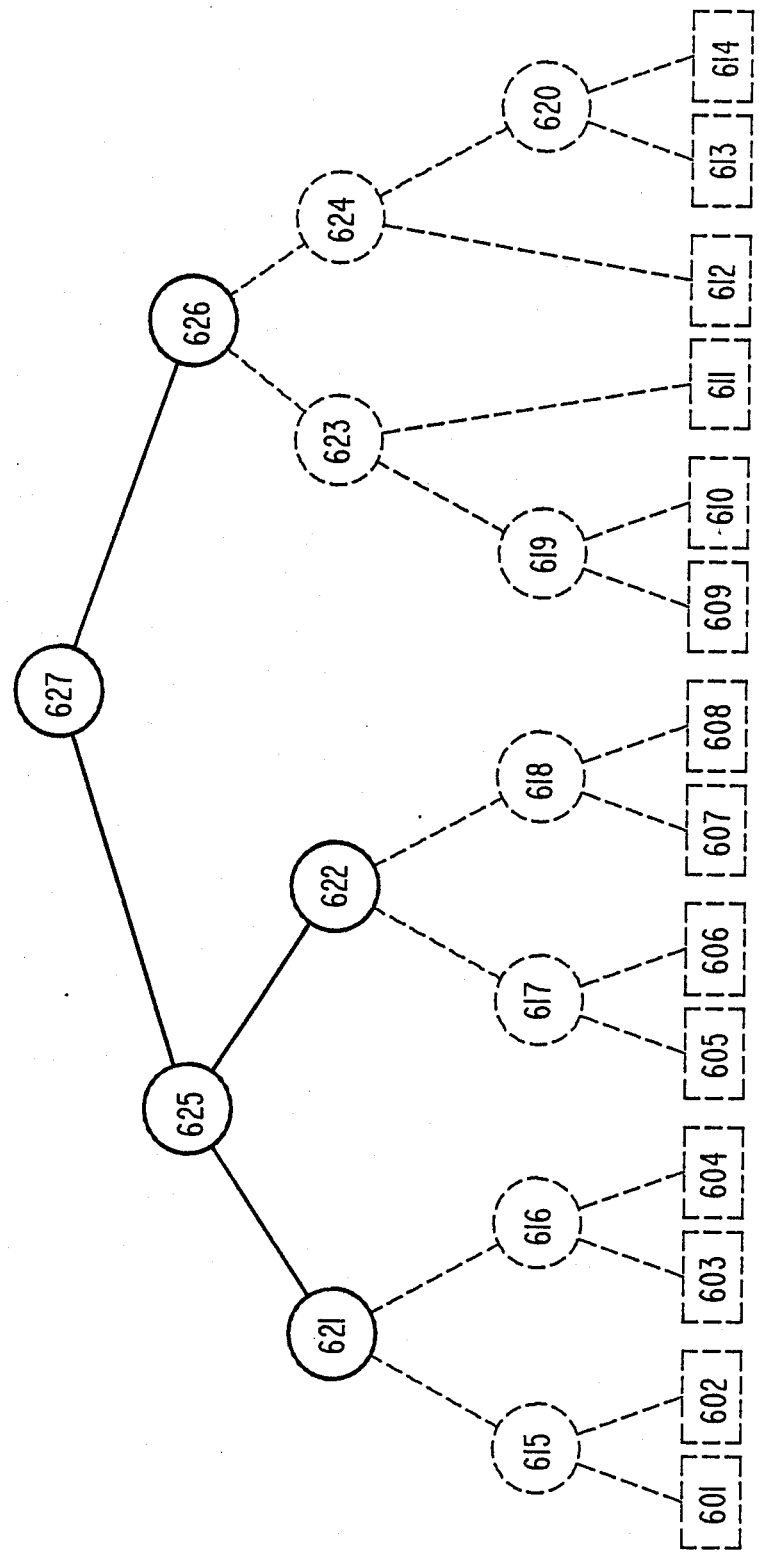
FIG. 17 illustrates a pruned binary tree which results from the operation described in conjunction with the flowchart of FIG. 16.

The process described in conjunction with FIG. 16 deletes the lowest level subtrees, leaving only their roots. FIG. 17 illustrates a binary tree similar to that of FIG. 6, in which the portions pruned during the first pass are illustrated in phantom. The roots of the B subtrees (621, 622, 626 of FIG. 17) then become leaves of the remaining binary tree. The next higher-level subtrees then become the B subtrees. In this case, with only one A subtree, it becomes the sole B subtree.

Decision block 230 of FIG. 2 determines whether there is only one node left in the pruned binary tree. If there is only one node remaining, the pruning process is finished. If more than one node remains, as in the case of FIG. 17, the logic proceeds by way of the NO output of decision block 230 and a logic path 232 back to block 224, to once again begin the process of placing the leaves of the pruned binary tree for optimum area and net lengths, followed by further pruning. Eventually, all the ascending levels of placement and pruning have been accomplished, whereby only a single node remains. At that time, decision block 230 routes the logic by the YES output to a further logic block 234, which establishes the orientation of macrocells, as detailed in conjunction with FIG. 18. The types of orientation evaluated and selected by the logic of FIG. 18 are illustrated in FIG. 20.

Figure 20:
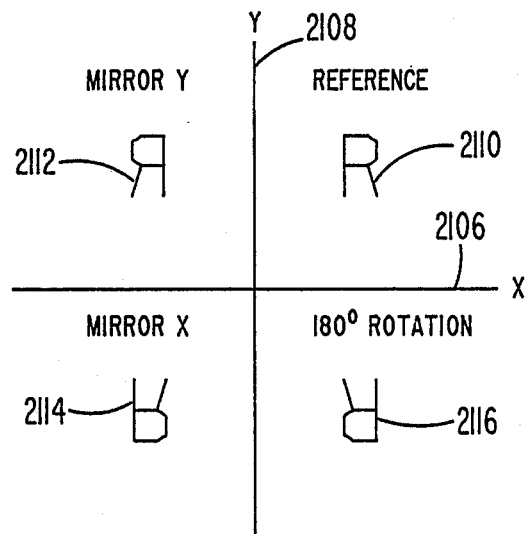
FIG. 20 illustrates the mirror and rotated images considered in the logic of FIG. 18.

In FIG. 20, an X axis 2106 and a Y axis 2108 are illustrated, together with the reference letter R illustrated as 2110 in a normal or reference position. A mirror image about the Y axis of normal position 2110 is illustrated as 2112 and is designated "mirror-Y". A mirror image of normal position 2110 about the X axis is illustrated as 2114 and designated "mirror-X", and a 180° rotation is illustrated as 2160.

In FIG. 18, block 1810 sets a variable V equal to the total number of macrocells. The logic flows from block 1810 to a further block 1812, which initializes the orientations of all macrocells to an arbitrary "normal" orientation. The logic then flows to a decision block 1814, which compares the value of variable V with zero to determine whether any macrocell orientations remain to be tested. If V=0, the logic flows by the YES output of decision block 1814 and a path 1816 to the output of FIG. 18, which is the output of block 234 of FIG. 2. If macrocell orientations are available to be tested, the logic flows by the NO output of decision block 1814 to a further block 1817. Block 1817 represents the assignment or setting of the best length (variable BLEN) to equal the total lengths of all nets connecting standard cell domains and macrocells. The logic then flows to a further block 1818, in which a variable FLAG is set equal to zero. The variable FLAG represents by a logic zero condition that the orientation of a macrocell has not changed as a result of the iteration, and a logic one indicates that the orientation has changed. A running variable W is set equal to one in a further block 1820. Variable W represents the number of macrocells which have been processed. Logic flows from block 1820 to a further block 1822 which assigns the current length CLEN to equal the total lengths of nets connecting standard cell domains and macrocells, with the $W^{th}$ macrocell in the mirror-X orientation relative to the current orientation. The logic then flows to a decision block 1824, in which the current length CLEN is compared with the previous best length BLEN. If CLEN is less than BLEN, the logic leaves decision block 1824 by the YES output and arrives at a block 1826, in which the current orientation of the $W^{th}$ macrocell is set to the mirror-X orientation, and the logic then flows by a logic path 1828 to a further block 1830, which sets the FLAG=1.

If the current length as evaluated in decision block 1824 is greater than the previous best length, the NO output of decision block 1824 directs the logic to block 1832, in which the current length CLEN is set equal to the total length of nets connecting standard cell domains and macrocells with the $W^{th}$ macrocell oriented in the mirror-Y orientation relative to the previously current orientation. Decision block 1834 compares CLEN with BLEN. If CLEN is less, the logic then flows by the YES outset of block 1834 to block 1836. Block 1836 sets the current orientation of the $W^{th}$ macrocell to the mirror-Y orientation, and directs the logic by path 1828 to block 1830.

If decision block 1834 finds that the current length is greater than the previous best length, its NO output directs the logic to a block 1838. In block 1838, the value of CLEN is determined with the $W^{th}$ macrocell in a 180° rotation relative to the current orientation of the macrocell. Decision block 1840 compares the net lengths as described above, and if the current orientation of the macrocell is the best (CLEN<BLEN), the YES output of decision block 1840 directs the logic to block 1842, in which the 180° rotation is established as the current orientation. The logic then flows to block 1830, in which FLAG is set to 1, as mentioned. From block 1830, the logic flows to block 1844, in which the value of best-length variable BLEN is set equal to the value of CLEN. The logic one, logic 0 state of FLAG is evaluated in block 1846. As mentioned, A FLAG condition of logic one represents reorientation of any one macrocell during the iteration. So long as a macrocell has changed orientation as a result of the iteration, further iterations are called for, and decision block 1846 directs the logic back to block 1818 to begin another iteration. If the iteration has resulted in no change in the position of any macrocell, then the orientation optimization procedure is finished, whereby the logic exits by the YES output of block 1846, and returns to block 238 of FIG. 2.

If CLEN is greater than or equal to BLEN as evaluated in decision block 1840 of FIG. 18, the NO output directs the logic to block 1848, which represents retention of the original orientation of the $W^{th}$ macrocell at the beginning of the iteration of that macrocell. The logic then flows to block 1850, representing the updating of variable W to W+1, which in turn represents selection of the next macrocell for orientation evaluation. Decision block 1852 compares the value of W with V, the total number of macrocells, to determine if all the macrocells have been evaluated. If macrocells remain to be evaluated, the logic loops by way of the NO output of decision block 1852 back to block 1822, whereas if all the macrocells have been evaluated for orientation, the logic flows to decision block 1846.

From block 234 of FIG. 2, the logic flows to a further block 236, which represents standard cell placement in the domains, and to a block 238, which represents detailed wire routing between the standard cells and macrocells as placed on the target surface. Such placement and wire routing is well known in the art, as mentioned above.

What is claimed is:

1. A method for laying out an assemblage of intermixed fixed size and shape rectangular macrocells and amorphous clusters of standard cell logic elements in a target region, comprising the steps of:

performing a first affinity factor evaluation of first affinity factors of all possible pairs of logic elements;

generating low-order standard cell subdomains consisting of logic element pairs having the most positive first affinity factors;

performing a second affinity factor evaluation of the affinity factors of all possible pair combinations of standard cell subdomains and logic elements;

generating higher-order standard cell subdomains, consisting of pairings of one of (a) standard cell subdomains with other standard cell subdomains, (b) standard cell subdomains with logic elements, and (c) logic elements with other logic elements, which pairings include only sets having identical second affinity factors;

iteratively repeating said performing a second affinity factor evaluation and generating higher-order steps to generate standard cell domains until combining any pair results in a second affinity factor more negative than zero;

performing a third affinity factor evaluation of the affinity factors of all possible pairs of macrocells and standard cell domains;

pairing those of said macrocells and standard cell domains having the most positive value of said third affinity factor to form superdomains;

performing a fourth affinity factor evaluation of the affinity factors of all possible pairs of superdomains, standard cell domains and macrocells;

forming higher-order superdomains by pairing those of said remaining superdomains, standard cell domains and macrocells having the most positive values of said fourth affinity factor;

iteratively repeating said forming and performing a fourth affinity evaluation steps until only one superdomain remains to form a binary tree structure having plural subtrees of different levels, each subtree including a root node and plural leaf nodes remote from said root node.

2. A method according to claim 1 further comprising the steps of:

estimating the size and shape of the target region to establish a target area;

identifying as B subtrees those subtrees in said binary tree structure in which the number of said standard cell domains and macrocells is less than a first predetermined number;

tagging as B root superdomains those superdomains at the root of each of said B subtrees;

identifying as A subtrees those subtrees in said binary tree structure in which the number of said B root superdomains is less than a second predetermined number;

tagging as A root superdomains those superdomains at the root of each of said A subtrees;

iteratively repeating said steps of identifying those A subtrees and tagging as A root superdomains to form subtrees of successively higher level until the entirety of said binary tree has been classified and only a single superdomain remains, whereby the root of each subtree becomes a leaf of the next higher level subtree;

beginning with the A subtree of highest level and proceeding in descending order level, successively forming all permutations, within said target area, of right-left, top-bottom configurations of those superdomains which form the leaves of said A subtree of highest order of said binary tree structure, while retaining a rectangular superdomain form with an aspect ratio selected to accept any macrocells contained therein;

for each subtree for which all right-left, top-bottom permutations are formed, evaluating the sum of the lengths of the connections between the interconnected superdomains of each permutation, and selecting for further evaluation that one permutation for which a quality criterion is optimized, said quality criterion including the consideration that said sum of the lengths of the connections should be minimized;

iteratively repeating said successively forming all permutations and evaluating the sum of the lengths of the connections steps for all A subtrees until all A subtrees have been processed and only B subtrees remain;

forming all possible permutations of each B subtree, and for each of said possible permutation of each B subtree, forming all possible domain right-left, top-bottom topological permutations, and for each of said topological permutations, calculating a quality criterion including at least one of (a) minimum area, (b) aspect ratio match, and (c) minimum the sum of the lengths of the connections between the interconnected domains; and selecting, from all of said possible permutations of each of said B subtrees and from all of said topological permutations of said B subtrees, that one permutation for which said quality criterion is optimized.

3. A method according to claim 2 further comprising the steps of:

pruning all but the root nodes of said B subtrees from said binary tree for said one permutation for which said quality criterion is optimized;

counting the number of remaining nodes, and if the number exceeds one, designating said root nodes of said pruned B subtrees as leaf nodes of the remaining binary tree; and repeating, until only one root node remains, the steps of (a) identifying as B subtrees, (b) tagging as B root superdomains, (c) identifying as A subtrees, (d) tagging as A root superdomains, (e) iteratively repeating said steps of identifying those A subtrees, (f) successively forming all permutations, (g) evaluating the sum of the length of the connections, (h) iteratively repeating said successively forming all permutations, (i) forming all possible permutations of each B subtree, (j) selecting that one permutation for which said quality criterion is optimized, (k) pruning, (l) and counting.

4. A method according to claim 3, further comprising the steps of:

for each macrocell, placing said macrocell in a mirror-X position, relative to its current position, and evaluating the total lengths of the interconnecting nets;

comparing, a first time, said total lengths of the interconnecting nets with a standard, and if better than said standard, setting the current position of said macrocell to equal said mirror-X position;

for each macrocell, placing said macrocell in a mirror-Y position relative to said current position, and evaluating the total lengths of said interconnecting nets;

comparing a second time, said total lengths of said interconnecting nets with said standard, and if better than said standard, setting said current position of said macrocell to equal said mirror-Y position;

for each macrocell, placing said macrocell in a 180° rotation position relative to said current position, and evaluating the total lengths of said interconnecting nets;

comparing, a third time, said total lengths of said interconnecting nets with said standard, and if better than said standard, setting said current position of said macrocell to said 180° rotation position; and repeating said (a) placing said macrocell in a mirror-X position, (b) comparing a first time, (c) placing said macrocell in a mirror-Y position, (d) comparing a second time, (e) placing said macrocell in a 180° rotation position, and (f) comparing, a third time steps until all macrocells remain in said current position throughout an iteration.

5. A method according to claim 4 wherein said standard is updated to equal the current value of said total lengths of said interconnecting nets whenever said current value of said total lengths is better than the current value of said standard.

6. A method according to claim 2 wherein said estimating step comprises the steps of:

summing together the areas of said macrocells and an estimated wire area for each macrocell to form an estimated total macrocell area;

summing together the areas of said standard cell domains and multiplying by one or more predetermined numbers to form a summed standard cell domain area including an estimated wire area;

summing together said estimated total macrocell sum area and said summed standard cell domain area to form said target area.

7. A method according to claim 6 further comprising the steps of:

estimating the width of said target region to form an estimated width by taking the square root of a quotient, wherein said quotient is the quotient of said target area divided by a desired aspect ratio fraction, wherein said aspect ratio fraction is the quotient of target region height divided by target region width; and estimating the height of said target region by dividing said target area by said estimated width of said target region.

8. A method according to claim 2 further comprising the steps of:

identifying the highest order type A subtree;

iteratively forming each of the possible topological layout variations of the lowest hierarchical level superdomains in said highest order type A subtree, and selecting that one layout variation for which a second quality criterion is optimized;

for that one topological layout variation of the lowest hierarchical level superdomains in said highest order type A subtree for which said second quality criterion is optimized, determining the size and aspect ratio of each superdomain at the lowest hierarchical level;

for all type A subtrees at the next lower hierarchical level from said highest hierarchical level, iteratively forming each of the possible topological layout variations of the lowest level superdomains contained therein, and selecting that one layout variation for which said second quality criterion is optimized, and determining the size and aspect ratio of each superdomain at the lowest hierarchical level;

repeating said second iteratively forming step until all type A subtrees have been evaluated;

for all type B subtrees of said one layout variation for which said second quality criterion is optimized, generating all possible permutations of the form of said B subtree;

for each of said permutations of the form of said B subtree, generating all possible topological variations of the leaf nodes, and selecting that one topological variation of the leaf nodes of that one permutation of the form of said B subtree for which a third quality criterion is optimized.

9. A method according to claim 2 wherein said first predetermined number is seven, and said second predetermined number is nine.

10. A method according to claim 2 wherein said aspect ratio match ARM is determined by:

$$ARM = |2 - R_X + R_Y|$$

where $R_X$ is the ratio of actual X dimension to target X dimension, and $R_Y$ is the ratio of actual Y dimension to target Y dimension, selected such that $(R_X)(R_Y) \leq 1$; and minimum ARM is best.

11. A method according to claim 2 wherein said quality criterion includes factors relating to said minimum area and factors relating to said interconnection length.

12. A method according to claim 1 wherein said first affinity factor evaluation step includes the further steps, for each pair of logic elements i and j, of:

counting the total number INTER of interconnections between all logic elements;

determining the total area SIZE of all logic elements;

counting the number C of interconnections between said pair of said logic elements having mutual interconnections;

determining the area $SIZE_i$ and $SIZE_j$ of each member of said pair of elements;

determining the affinity factor CF for each said pair of elements by the equation:

$$CF = (INTER - C) \times SIZE + (SIZE_i + SIZE_j) \times C.$$

13. A method according to claim 1 wherein each of said affinity factor evaluation steps other than said first affinity factor evaluation step includes for each pair of logic elements, subdomains, domains, macrocells or superdomains having mutual interconnections, the further steps of:

determining the total number INTER of interconnections between all N elements;

counting the number C of interconnections between said pair of said elements;

determining the number $INTRA'_p$ of intraconnections in the $p^{th}$ element;

determining the area $SIZE_p$ of each of the N elements;

determining the number $INTRA'_j$ of intraconnections in the $i^{th}$ and $j^{th}$ elements under consideration;

determining the area $SIZE_i$ and $SIZE_j$ of each member i,j of said pair of elements;

determining the affinity factor CF for each said pair of elements by the equation:

$$CF = (\text{INTER} - C) + \sum_{p=1}^{p=i-1} (\text{INTER}_p \times \text{SIZE}_p) +$$

-continued $$\sum_{p=i+1}^{p=j-1} (\text{INTRA}_p \times \text{SIZE}_p) + \sum_{p=j+1}^{p=N} (\text{INTRA}_p \times \text{SIZE}_p) +$$

$$(\text{INTRA}_i + \text{INTRA}_j + C) \times (\text{SIZE}_i + \text{SIZE}_j)$$

where N is the current total number of elements.

* * * * *